(12) United States Patent
Hudner

(10) Patent No.: US 10,454,463 B1
(45) Date of Patent: Oct. 22, 2019

(54) ADAPTABLE QUANTIZERS HAVING DEDICATED SUPPLY VOLTAGE FOR TAIL DEVICE DRIVERS

(71) Applicant: Xilinx, Inc., San Jose, CA (US)

(72) Inventor: James Hudner, Charleville (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/107,850

(22) Filed: Aug. 21, 2018

(51) Int. Cl.
*H03K 5/24* (2006.01)
*G06F 1/3237* (2019.01)
*G05F 3/16* (2006.01)
*G06F 3/16* (2006.01)

(52) U.S. Cl.
CPC .............. *H03K 5/249* (2013.01); *G05F 3/16* (2013.01); *G06F 1/3237* (2013.01)

(58) Field of Classification Search
CPC .......... H03K 19/0013; H03K 19/0016; H03K 5/023; H03K 5/08; H03K 5/125; H03K 5/14; H03K 5/1565; H03K 5/2472; H03K 3/011
USPC ................................. 327/538, 539, 540, 541
See application file for complete search history.

(56) References Cited

U.S. PATENT DOCUMENTS

| 6,333,649 | B1 | 12/2001 | Dick et al. |
| 6,876,698 | B1 | 4/2005 | Dick et al. |
| 8,395,440 | B2 * | 3/2013 | Sandhu ............... H03K 17/145 327/540 |
| 9,755,655 | B1 | 9/2017 | Hudner |

OTHER PUBLICATIONS

Kim, Jaeha, et al., Impulse Sensitivity Function Analysis of Periodic Circuits, ICCAD 2008, Nov. 10-13, 2008, 6 pages, San Jose, CA.
Kim, Jaeha, et al., Simulation and Analysis of Random Decision Errors in Clocked Comparators, Jaeha Kim et al., IEEE Transactions on Circuits and Systems—I: Regular Papers, vol. 56, No. 8, Aug. 2009, pp. 1844-1857.
Kobayashi, Tsuguo et al.,A Current-Controlled Latch Sense Amplifier and a Static Power-Saving Input Buffer for Low-Power Architecture, IEEE Journal of Solid-State Circuits, vol. 28, No. 4, Apr. 1993, pp. 523-527.

(Continued)

*Primary Examiner* — John W Poos
(74) *Attorney, Agent, or Firm* — Patterson + Sheridan, LLP

(57) ABSTRACT

Apparatus and associated methods relate to a dynamic quantizer circuit including a tail voltage supply magnitude (VTAIL) distinct from a general supply voltage (Avcc/Avss), VTAIL providing power to a tail clock buffer to generate tail clock signals to tail devices. In an illustrative example, a compensation processor may control a regulator producing a determined VTAIL value in response to one or more parametric signals, for example, the Avcc voltage value, a circuit temperature and a transistor speed process (TSP). The TSP signal may be determined, for example, by process-dependent circuit devices. The compensation processor may be, for example, configured to lower VTAIL in response to detecting a worst-case RMS noise corner, or to raise VTAIL in response to detecting a worst-case clock-to-q corner. Various adjustable VTAILs may be configured to continuously optimize RMS noise, offset and speed performance with low power consumption in various quantizers over process, voltage and/or temperature.

20 Claims, 17 Drawing Sheets

(56) References Cited

OTHER PUBLICATIONS

Miyahara, Masaya, et al., A Low-Noise Self-Calibrating Dynamic Comparator for High-Speed ADCs, IEEE Asian Solid-State Circuits Conference, Nov. 3-5, 2008 / Fukuoka, Japan, pp. 269-272.
Montanaro, James, et al., A 16OMHz 32b 0.5W CMOS RISC Microprocessor,1996 IEEE International Solid-State Circuits Conference,vol. 31, No. 11, Nov. 1996, pp. 1703-1714.
Nikoozadeh, Amin et al., An Analysis of Latch Comparator Offset Due to Load Capacitor Mismatch, IEEE Transactions on Circuits and Systems—II: Express Briefs, vol. 53, No. 12, Dec. 2006, pp. 1398-1402.
Nuzzo, Pierluigi, et al., Noise Analysis of Regenerative Comparators for Reconfigurable ADC Architectures, IEEE Transactions on Circuits and Systems—I: Regular Papers, vol. 55, No. 6, Jul. 2008,pp. 1441-1454.
Schinkel, Daniel, et al., A Double-Tail Latch-Type Voltage Sense Amplifier with 18ps Setup+Hold Time, 2007 IEEE International Solid-State Circuits Conference, Session 17, Analog Techniques and PLLs, 17.7, pp. 314-315, and 605.
Toifl, Thomas, et al., A 22-Gb/s PAM-4 Receiver in 90-nm CMOS SOI Technology, IEEE Journal of Solid-State Circuits, vol. 41, No. 4, Apr. 2006, 954-964.
Wang, Niantsu N., On the Design of MOS Dynamic Sense Amplifiers, IEEE Transactions on Circuits and Systems, vol. CAS-29, No. 7, Jul. 1982, pp. 467-477.
Wang, Yun-Ti et al., An 8-Bit 150-MHz CMOS A/D Converter, IEEE Journal of Solid-State Circuits, vol. 35, No. 3, Mar. 2000, pp. 308-317.

\* cited by examiner

ADAPTABLE QUANTIZERS HAVING DEDICATED SUPPLY VOLTAGE FOR TAIL DEVICE DRIVERS

TECHNICAL FIELD

Various embodiments relate generally to digital communications and more particularly relates to quantizer circuits.

BACKGROUND

Modern networks are responsible for interconnecting computing devices operable to exchange data. Data may be exchanged from circuit board to circuit board along a common backplane, for example, in a computer or server. In some implementations, data may be exchanged over long distances, for example, from a travel agent's computer to an airline server on a cloud network. Modern networks may employ a number of mediums including physical wires, radio frequency (RF) channels or fiber optics. Data exchanged between computing devices may include data packets including multiple bits. In some implementations, data may be transmitted one bit at a time, or serially. Such serial data transmissions, though containing digitized information encoded in logic levels, may be analog in nature, especially in high speed data transmissions.

Quantizer circuits determine a logic state in response to an analog signal level, receiving high speed serial data transmissions and transmitting logic signals that represent the serial input. For example, some quantizer circuits may receive a serial data transmission signal formed of a differential pair. On various clocked quantizers where the quantizer output represents the logic state of a quantizer input signal on a coincident active clock edge, the time between a signal state change on the quantizer clock input and the corresponding quantizer output state change may be referred to as "clock-to-q."

SUMMARY

Apparatus and associated methods relate to a dynamic quantizer circuit including a tail voltage supply magnitude (VTAIL) distinct from a general supply voltage (Avcc/Avss), VTAIL providing power to a tail clock buffer to generate tail clock signals to tail devices. In an illustrative example, a compensation processor may control a regulator producing a determined VTAIL value in response to one or more parametric signals, for example, the Avcc voltage value, a circuit temperature and a transistor speed process (TSP). The TSP signal may be determined, for example, by process-dependent circuit devices. The compensation processor may be, for example, configured to lower VTAIL in response to detecting a worst-case RMS noise corner, or to raise VTAIL in response to detecting a worst-case clock-to-q corner. Various adjustable VTAILs may be configured to continuously optimize RMS noise, offset and speed performance with low power consumption in various quantizers over process, voltage and/or temperature.

Various embodiments may achieve one or more advantages. For example, some embodiments may detect and leverage the TSP traits, to advantageously lower input referred RMS noise, input referred offset voltage and power for fast TSP quantizers, and to advantageously lower clock-to-q for slow TSP quantizers. Some implementations may continuously adjust VTAIL to provide continuous performance optimization over process, voltage and temperature (PVT). Various implementations may simultaneously provide maximum quantizer performance (low noise and low clock-to-q) at low power. Some implementations may further reduce power consumption, by lowering the magnitude of VTAIL further in response to low data rate detection. The continuous self-adjustment of VTAIL in various applications to maximize performance may mitigate expensive production testing and trimming. The application of VTAIL to various tail clock buffer supply inputs may be advantageously employed in various quantizers including sense amplifier topologies and double-tail topologies, and in those that may include current-based or capacitor-based offset correction circuitry. In some examples, a faster than nominal TSP may be detected to lower input referred RMS noise and input offset voltage of various quantizer circuits. In some examples, a slower than nominal TSP may be detected to lower clock-to-q of various quantizer circuits.

In an exemplary aspect, a power source to compensate performance of a quantizer circuit may include a voltage regulator. The voltage regulator may have an input terminal and an output terminal. In operation, the voltage regulator may be operable to supply a tail voltage to the output terminal as a function of a regulation control signal applied to the input terminal. The output terminal may be operably connected to supply operating power to a driver circuit. The driver circuit may be configured to buffer a clock signal to a control terminal of a tail device in a quantizer circuit (QC). The tail device may be configured to enable or disable operating current through an input circuit of the QC in response to the buffered clock signal. The buffered clock signal may have an amplitude that is a function of the tail voltage. The QC may include a regeneration circuit configured to receive operating power from an Avcc power domain.

The power source to compensate performance of a quantizer circuit may include a process sensor configured to generate a process dependent signal indicative of a timing performance of one or more devices in the QC embodied on a semiconductor substrate. The power source to compensate performance of a quantizer circuit may include a temperature sensor configured to generate a temperature signal indicative of a temperature of one or more devices in the QC. The power source to compensate performance of a quantizer circuit may include a compensation processor operatively coupled to the process sensor and the temperature sensor.

The compensation processor may be configured to generate the regulation control signal as a function of the process dependent signal and the temperature signal. The compensation processor may be configured to modulate the tail voltage in response to the process dependent signal and the temperature signal. The tail voltage may be independently regulatable relative to the Avcc power domain.

The tail voltage may be directly coupled to the Avcc power domain such that substantially all the operating power supplied to the QC may be received from the output terminal of the voltage regulator. The tail device may include a first tail device and a second tail device. The QC may include the input circuit coupled to the regeneration circuit and may be configured to receive an input signal. The QC may include offset correction circuitry. The QC may be operatively coupled to supply a data signal to a downstream circuit. The downstream circuit may be coupled to the tail voltage to receive operating power.

The power source may include a voltage supply node configured to receive a voltage signal from which the voltage regulator derives the tail voltage. The compensation processor may be operatively coupled to the Avcc power domain. The compensation processor may be configured to generate the regulation control signal to modulate the tail voltage as a function of the Avcc power domain. The power source may include a data rate signal generator configured to generate a data rate signal indicative of a data rate of the buffered clock signal.

The compensation processor may be operatively coupled to receive the data rate signal and may be configured to generate the regulation control signal as a function of the received data rate signal. The compensation processor may be configured to modulate the tail voltage in response to the received data rate signal. The compensation processor may be configured to modulate the tail voltage to increase a current through the tail device when the QC is operating at an operating point associated with a worst-case clock-to-q corner. The compensation processor may be configured to modulate the tail voltage to decrease a current through the tail device when the QC is operating at an operating point associated with a worst-case RMS noise corner.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, an exemplary use case of an automatic and continuous Avcc_tail adjustment circuit providing maximum performance at low power is presented with reference to FIG. 1. Second, various circuit topologies incorporating a separate Avcc_tail clock supply to power a tail clock signal, which drives one or more tail devices are briefly introduced with reference to FIGS. 2A-7. Third, with reference to FIGS. 8A-9B, the discussion turns to exemplary embodiments that illustrate control of an Avcc_tail supply. Next, with reference to FIGS. 10-11, further explanatory discussion and experimental data presents exemplary potential improvements in input referred RMS noise, input referred voltage offset and clock-to-q. Next, in FIGS. 12A-12B, an exemplary programmable integrated circuit (IC) on which the disclosed circuits and processes may be implemented is described. Finally, with reference to FIG. 13, an exemplary method to compensate performance of a power source of a quantizer circuit is described.

Examples of quantizer circuit implementation topologies that are similar to those disclosed in this application with reference to FIGS. 2A, 3-7, are described with reference to, for example, FIGS. 1-7A, 8 and 9 of U.S. patent application Ser. No. 15/453,707, titled "Dynamic Quantizers having Multiple Reset Levels," filed by James G. Hudner, on Mar. 8, 2017, (hereinafter referred to as "Hudner-2017") the corresponding disclosure of which is hereby incorporated by reference.

Throughout this application, "transistor speed process" or "TSP" may indicate a relative transistor speed associated with a semiconductor fabrication process, with a given temperature, voltage and circuit pattern. For example, transistors with a fast TSP, may switch at a faster rate (lower clock-to-q) than transistors with a slow TSP. For a given set of input conditions (e.g., voltage, clock speed, temperature), fast TSP devices may consume more power than slow TSP devices.

Figure 1:
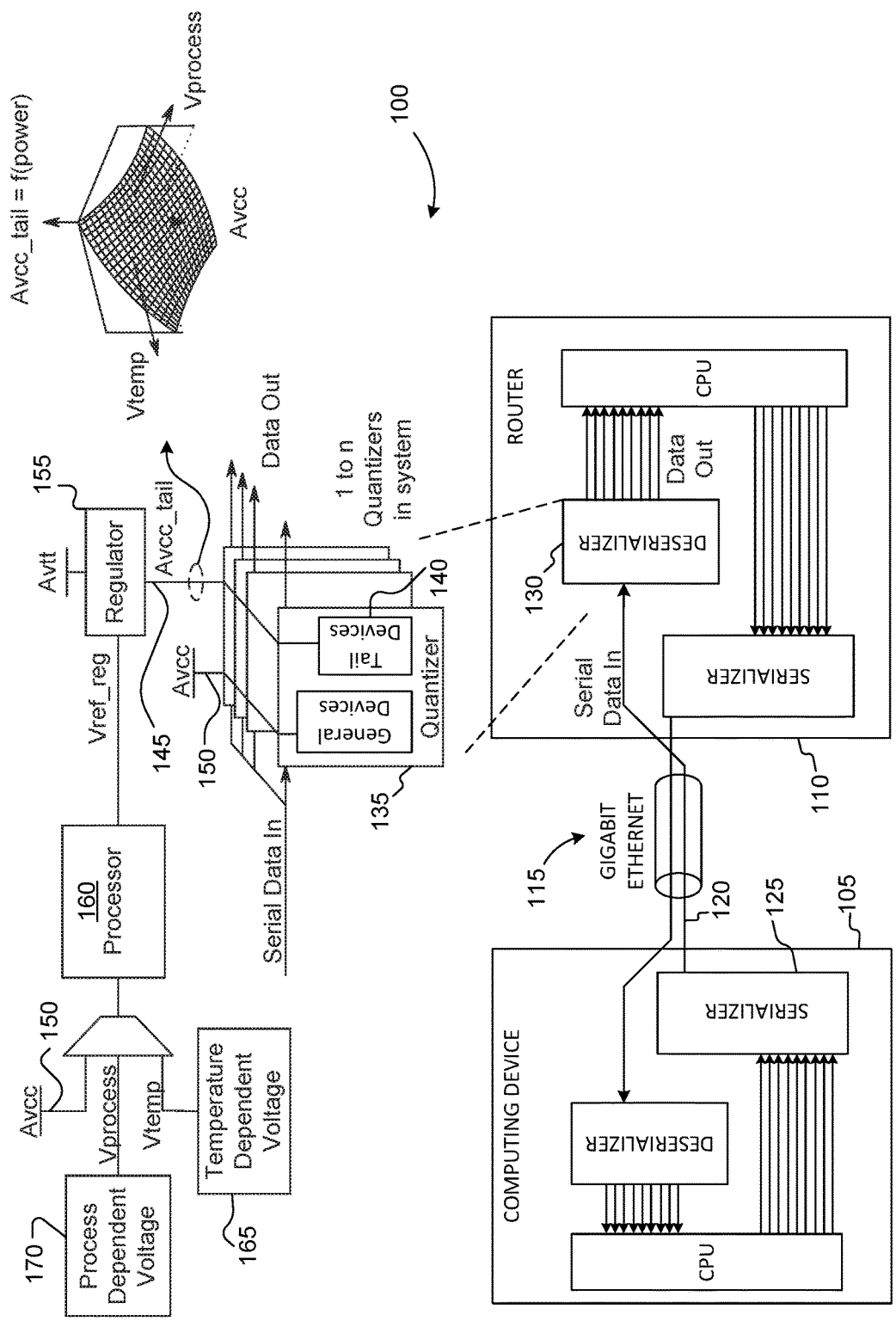
FIG. 1 depicts an exemplary dynamic quantizer circuit implemented within a deserializer circuit.

FIG. 1 depicts an exemplary dynamic quantizer circuit implemented within a deserializer circuit. Multiple exemplary dynamic quantizer circuits controlled by various systems may simultaneously lower RMS noise, offset voltage, clock-to-q and power of the system, for example, a high-speed serializer/deserializer (SERDES) system. In various implementations, multiple exemplary dynamic quantizer circuits controlled by various systems may simultaneously lower RMS noise, offset voltage, clock-to-q and power of various analog to digital converter (ADC) systems. In some examples, the ADCs may be time-interleaved successive approximation (TISAR) ADCs. A computer communication application 100 includes a computing device 105 (e.g., personal computer) in communication with a router 110 over a gigabit ethernet network 115. The computing device 105 provides high-speed serial data 120 from a serializer circuit 125. A deserializer circuit 130 receives the high-speed serial data 120.

In the depicted example, the deserializer circuit 130 includes a dynamic quantizer circuit 135. In various examples, the dynamic quantizer circuit 135 may be implemented, for example, within a multi-gigabit transceiver (MGT) on a field programmable gate array (FPGA). The dynamic quantizer circuit 135 includes one or more tail devices 140. The one or more tail devices 140 are powered by an Avcc_tail supply 145. The Avcc_tail supply 145 is distinct from a general supply voltage (Avcc) 150. The Avcc_tail supply 145 provides power to devices and signals that are related to tail functions. The Avcc_tail supply 145 is regulated by a power supply regulator 155. The power supply regulator 155 is controlled by a processor 160.

The processor 160 may determine and control an input voltage value Vref_reg to the Avcc_tail supply 145 in response to (1) a voltage value (e.g., Avcc 150), (2) a circuit temperature 165 and (3) a transistor speed process (TSP) 170. In various examples, the processor 160 may continuously adjust the Avcc_tail supply 145 in response to the Process 170, Voltage (e.g., Avcc 150), and Temperature 165 (PVT). The continuous adjustment of the Avcc_tail supply 145 in response to PVT may advantageously minimize input referred RMS noise, input referred offset voltage and clock-to-q of the dynamic quantizer circuit 135.

Accordingly, the processor 160 may be configured to lower the Avcc_tail supply 145 in response to a worst-case RMS noise corner (e.g., to reduce quantizer noise and offset voltage) and/or in response to a fast corner, for example. The processor 160 may be configured to raise the Avcc_tail supply 145 in response to detecting a worst-case clock-to-q corner (e.g., to reduce quantizer clock-to-q response) and/or in response to detecting a slow corner, for example. For example, the fast corner may be detected when a combination of a fast TSP, a maximum supply voltage and a minimum temperature is detected. The worst-case RMS noise corner may be detected when a combination of a fast TSP, a minimum supply voltage and a maximum temperature is detected. The slow corner may be detected when a combination of a slow TSP, a minimum supply voltage and a maximum temperature is detected. The worst-case clock-to-q corner may be detected when a combination of a slow TSP, a minimum supply voltage and a maximum temperature is detected.

Reduction of Avcc_tail supply 145 may reduce overall operation current of various dynamic quantizer circuits 135 by reducing the amplitude of a gating signal on tail devices 140. Reduction of the overall operation current may also reduce overall power consumption. Accordingly, reduction of the Avcc_tail supply 145 may result in a reduction of overall power consumption. Various distinct adaptable Avcc_tail supplies 145 may be configured to reduce overall power consumption, input referred offset voltage and input referred RMS noise of various dynamic quantizer circuits 135 over process, voltage and/or temperature.

The power supply regulator 155 controlled by the processor 160, in response to the PVT inputs (a voltage value (e.g., Avcc 150), the circuit temperature 165 and the TSP 170), may form an automatic self-adjusting supply.

In some exemplary implementations, the automatic self-adjusting supply may be configured to lower the Avcc_tail supply 145 in the worst-case RMS noise corner and/or the fast corner in order to lower input referred RMS noise and input referred offset voltage of the quantizer. Although lowering Avcc_tail may increase clock-to-q, it may be substantially counteracted by the inherently low clock-to-q in the worst-case RMS noise corner and/or the fast corner. Lowering Avcc_tail may advantageously reduce power, which may be advantageous in the fast corner, since the fast corner may exhibit inherently high-power consumption.

In some exemplary implementations, the automatic self-adjusting supply may be configured to raise Avcc_tail supply 145 in the slow corner and/or worst-case clock-to-q corner in order to lower clock-to-q of the quantizer. Although raising Avcc_tail increases power consumption and input referred RMS noise, these may be, for example, substantially counteracted by the inherently low power consumption, and low input referred RMS noise of the quantizer in the slow corner and/or worst-case clock-to-q corner.

Figure 2A:
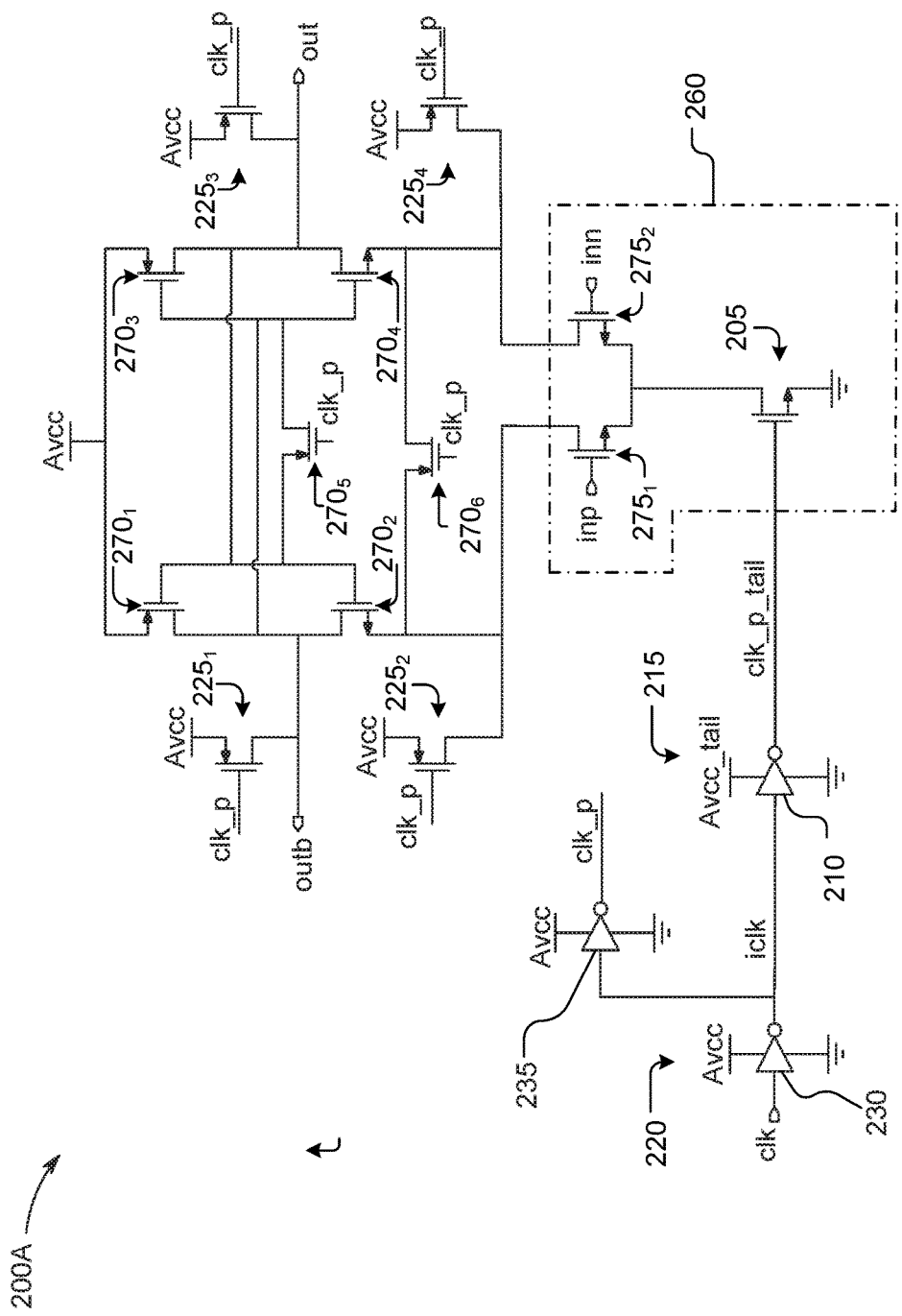
FIG. 2A depicts a schematic view of an exemplary quantizer circuit with a sense amplifier topology, implemented with a separate power domain (Avcc_tail) for powering a tail device and a tail clock signal.

FIG. 2A depicts a schematic view of an exemplary quantizer circuit with a sense amplifier topology, implemented with a separate power domain (Avcc_tail) for powering a tail device and a tail clock signal. A sense amplifier quantizer circuit 200A includes a tail transistor 205. In some examples, the tail transistor 205 may be a tail device. A tail clock buffer 210 controls the gate of the tail transistor 205 with a signal clk_p_tail. The tail clock buffer 210 is powered by an Avcc_tail power domain 215. The Avcc_tail power domain 215 is distinct from an Avcc power domain 220. The Avcc_tail power domain 215 may be referred to as VTAIL. The Avcc power domain 220 powers the sense amplifier quantizer circuit 200A, including a set of reset transistors 2251, 2252, 2253, 2254. In various examples, the quantizer circuit 200A may be a dynamic quantizer circuit. In some implementations, capacitance may be added to the drains of reset transistors 2252 and 2254 to form a capacitor based offset correction.

The Avcc power domain 220 powers a main clock buffer 230. The main clock buffer 230 receives a clock (clk) and generates an intermediate clock (iclk). The main clock buffer 230 feeds the intermediate clock (iclk) to the tail clock buffer 210 and a clock buffer 235. The clock buffer 235 produces a clock signal (clk_p). An input circuit 260 includes the tail transistor 205, a transistor 2751 and a transistor 2752. The clk_p and the clk_p_tail are non-inverted relative to clk. The iclk is inverted relative to clk.

The distinct Avcc_tail power domain 215 may be strategically reduced in a worst-case RMS noise corner (to reduce quantizer noise and offset voltage) and/or fast corner to lower input referred RMS noise, input referred offset voltage, and power consumption. Reduction of the Avcc_tail power domain 215 may reduce overall operation current of various sense amplifier quantizer circuits 200A by reducing the amplitude of the gating signal (clk_p_tail) on tail transistors 205. Reduction of the overall operation current may reduce overall power consumption. Accordingly, reduction of the Avcc_tail power domain 215 may result in a reduction of overall power consumption. Various automatic self-adjusting Avcc_tail power domain 215 may be configured to reduce overall power consumption, input referred offset voltage and input referred RMS noise in various sense amplifier quantizer circuits 200A over process, voltage and/or temperature.

The distinct Avcc_tail power domain 215 may be strategically increased in a worst-case clock-to-q corner and/or slow corner to lower clock-to-q timing. Increasing the Avcc_tail power domain 215 may increase overall operation current of various sense amplifier quantizer circuits 200A by increasing the amplitude of a gating signal (clk_p_tail) on tail transistor 205. In some examples, such increased current may advantageously decrease quantizer integration time and regeneration time, increasing overall quantizer circuit 200A speed performance. Various automatic self-adjusting Avcc_tail power domain 215 may be configured to reduce clock-to-q timing in various sense amplifier quantizer circuits 200A over process, voltage and/or temperature. In the depicted example, an output circuit configured to output a differential signal (out, outb) in response to the input circuit 260. In the depicted embodiment, the output circuit is formed as a regeneration circuit that includes transistors 2701, 2702, 2703, 2704, 2705, 2706.

Figure 2B:
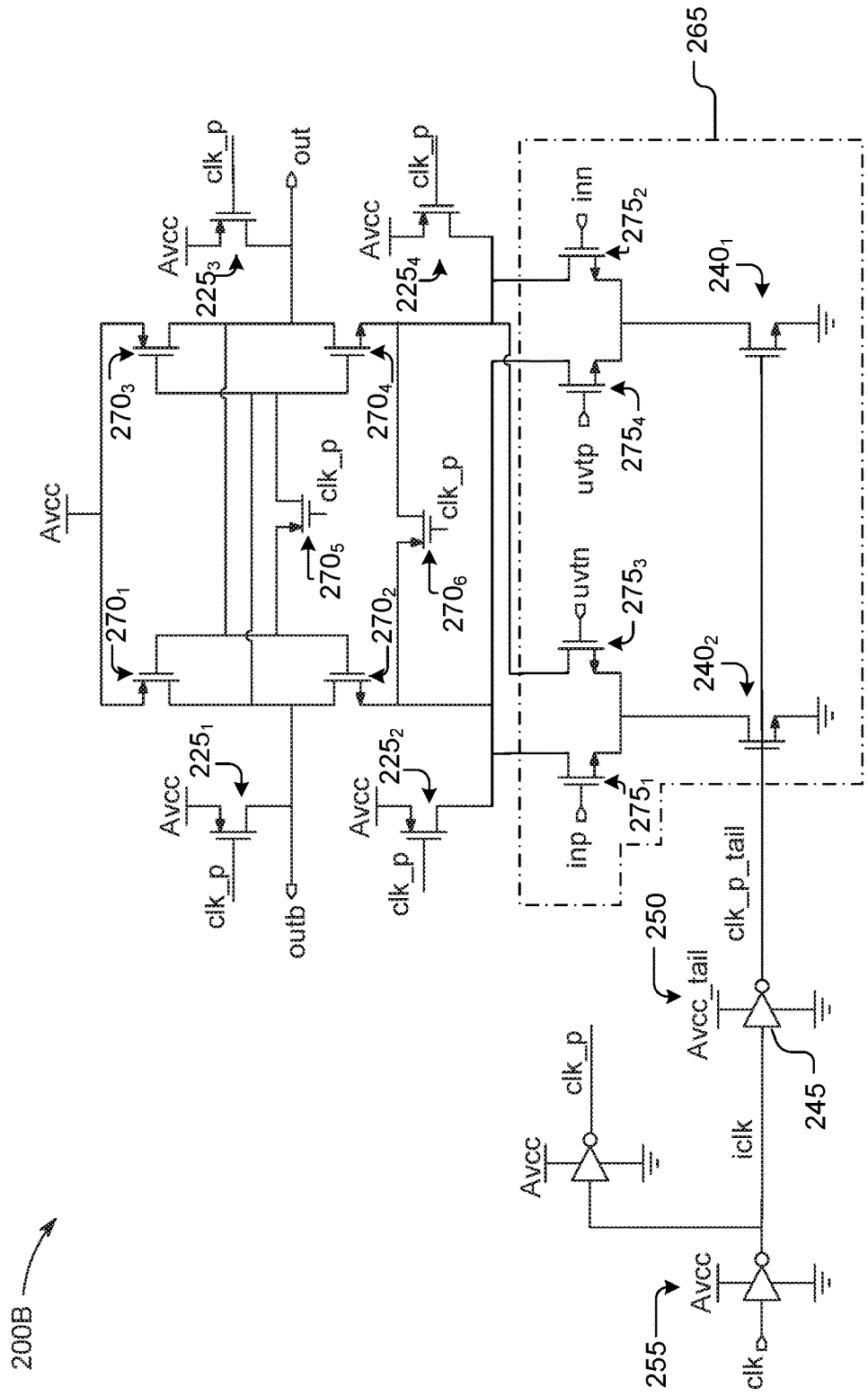
FIG. 2B depicts a schematic view of the exemplary circuit of FIG. 2A with a current-based offset correction.

FIG. 2B depicts a schematic view of the exemplary circuit of FIG. 2A with a current-based offset correction. A sense amplifier quantizer circuit 200B (with current based offset correction) includes tail transistors 2401 and 2402. A tail clock buffer 245 controls the gate of the tail transistors 2401 and 2402. In various examples, the tail transistors 2401 and 2402 may be tail devices. The tail clock buffer 245 is powered by an Avcc_tail power domain 250. The Avcc_tail power domain 250 is distinct from an Avcc power domain 255. The Avcc_tail power domain 250 may be referred to as VTAIL. An input circuit 265 includes the tail transistors 2401, 2402, and transistors 2751, 2752, 2753, 2754. In various implementations, an automatic self-adjusting Avcc_tail power domain 250 may continuously and simultaneously reduce input referred RMS noise and offset voltage, reduce clock-to-q timing and reduce overall power consumption in various sense amplifier quantizer circuits 200B (with current based offset correction) over process, voltage and/or temperature.

Figure 3:
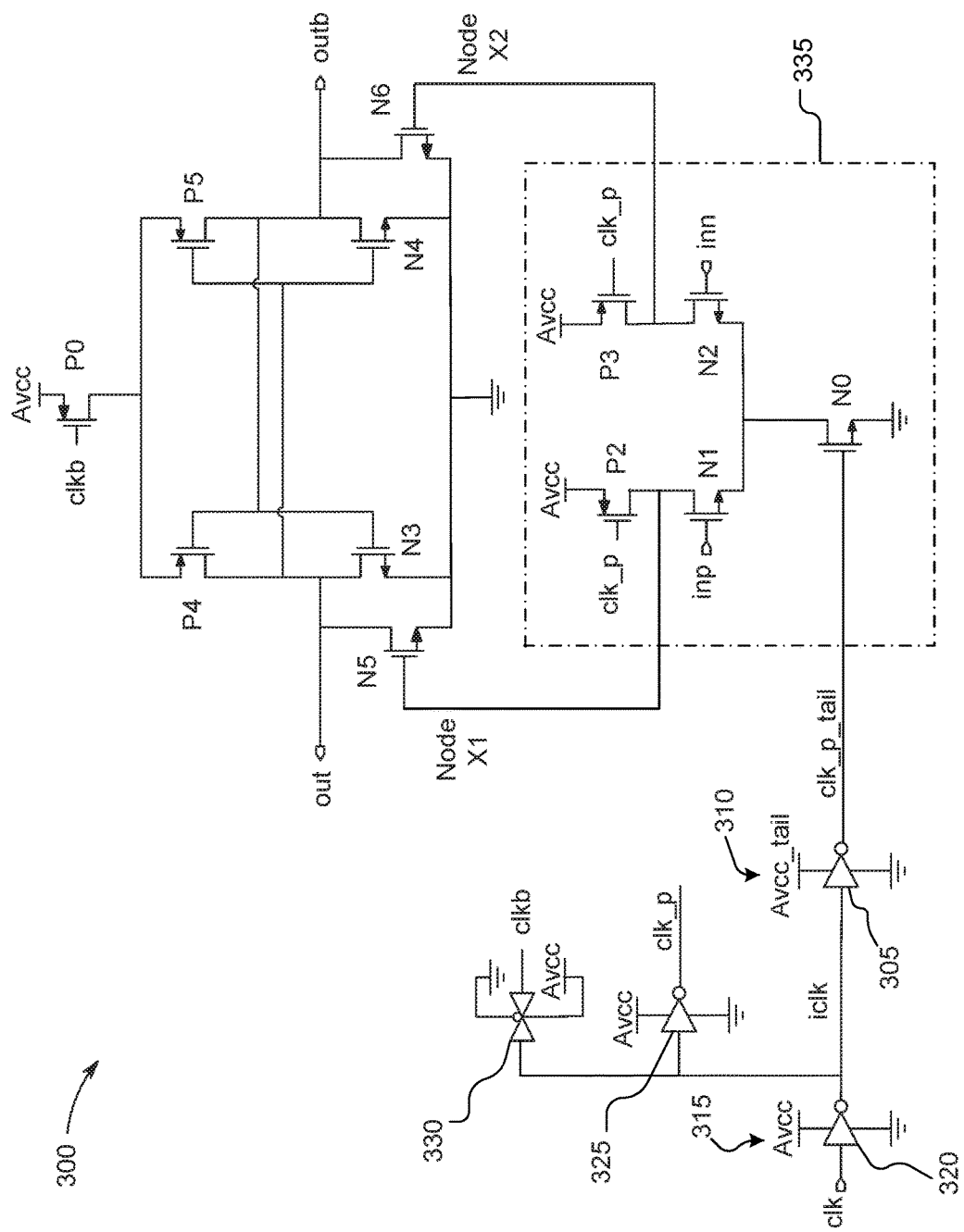
FIG. 3 depicts a schematic view of an exemplary quantizer circuit with a double-tail latch topology, implemented with a separate power domain (Avcc_tail) for powering a tail device and a tail clock signal.

FIG. 3 depicts a schematic view of an exemplary quantizer circuit with a double-tail latch topology, implemented with a separate power domain (Avcc_tail) for powering a tail device and a tail clock signal. A double-tail latch quantizer 300 includes a tail transistor N0. A tail clock buffer 305 produces a clock signal (clk_p_tail). The clk_p_tail controls the gate of the tail transistor N0. In various examples, the tail transistor N0 may be a tail device. The tail clock buffer 305 is powered by an Avcc_tail power domain 310. The current through an input circuit stage of the double-tail latch quantizer 300 may be controlled by the clk_p_tail pulse amplitude, which is governed by the Avcc_tail power domain 310. The Avcc_tail power domain 310 is distinct from an Avcc power domain 315. The Avcc_tail power domain 310 may be referred to as VTAIL. The Avcc power domain 315 powers the double-tail latch quantizer 300, including a set of reset transistors P2 and P3. An input circuit 335 includes the tail transistor N0. Various adaptable Avcc_tail power domains 310 may be configured to continuously and simultaneously reduce input referred RMS noise and offset voltage, reduce clock-to-q timing and reduce overall power consumption in double-tail latch quantizers 300 over process, voltage and/or temperature.

The Avcc power domain 315 powers a main clock buffer 320. The main clock buffer 320 receives a clock (clk) and generates an intermediate clock (iclk). The main clock buffer 320 is powered by the Avcc power domain 315 and feeds the intermediate clock (iclk) to the tail clock buffer 305, a clock buffer 325 and a TGATE 330. The clock buffer 325 is powered by the Avcc power domain 315 and produces a clock signal (clk_p). The TGATE 330 produces a clock signal (clkb). The TGATE 330 may operate as a continuous drive and may facilitate alignment of clkb to clk_p and clk_p_tail. The clk_p and the clk_p_tail are non-inverted relative to clk. The iclk and clkb are inverted relative to clk.

Figure 4:
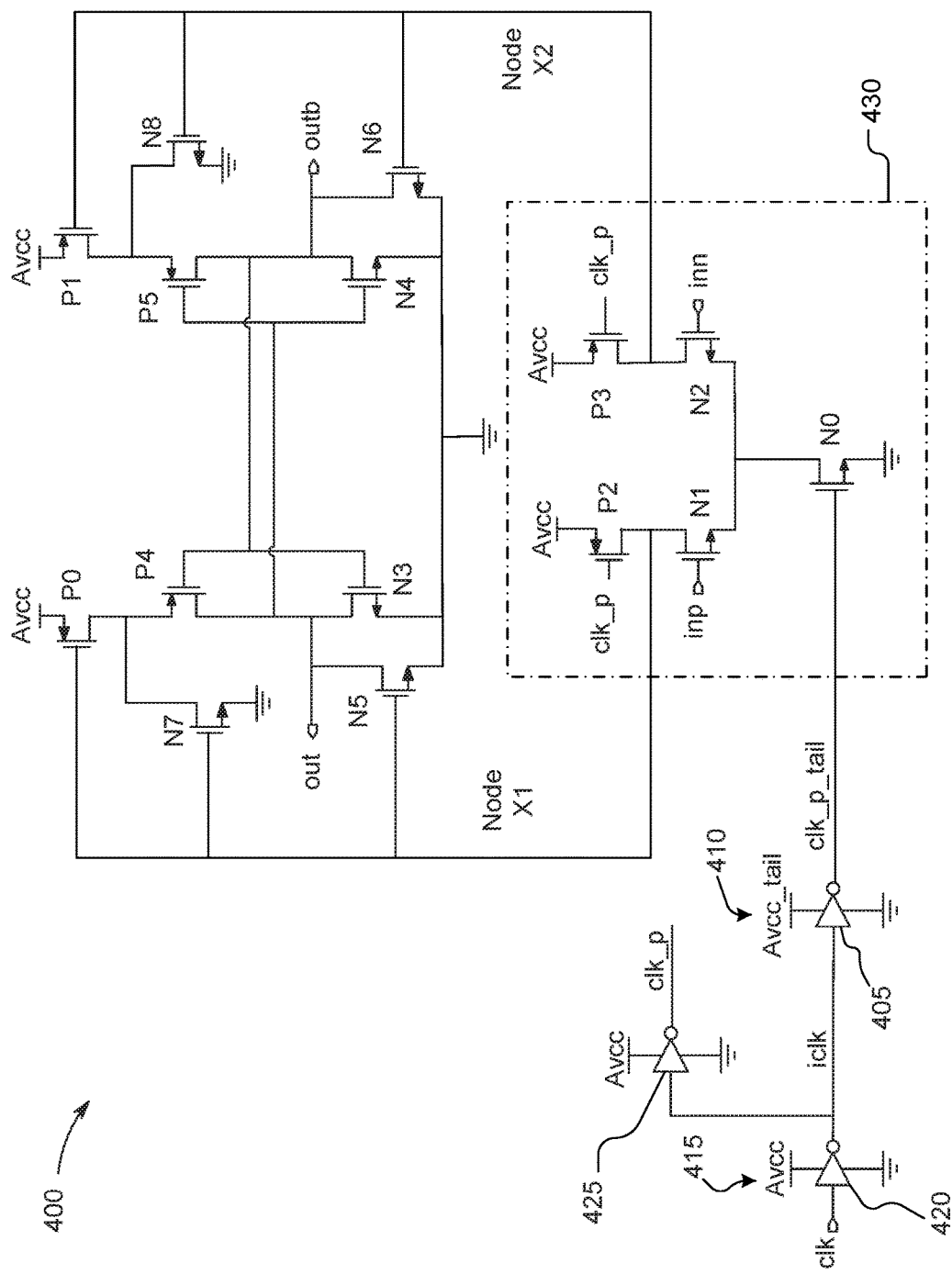
FIG. 4 depicts a schematic view of the exemplary circuit of FIG. 3 with a single-phase clock input feature and extra gain paths.

FIG. 4 depicts a schematic view of the exemplary circuit of FIG. 3 with a single-phase clock input feature and extra gain paths. A double-tail latch quantizer 400 includes a tail transistor N0. In various examples, the tail transistor N0 may be a tail device. A tail clock buffer 405 produces a clock signal (clk_p_tail), which controls the gate of the tail transistor N0. The tail clock buffer 405 is powered by an Avcc_tail power domain 410. The current through an input circuit stage of the double-tail latch quantizer 400 may be controlled by the clk_p_tail pulse amplitude, which is governed by the Avcc_tail power domain 410. The Avcc_tail power domain 410 is distinct from an Avcc power domain 415. The Avcc_tail power domain 410 may be referred to as VTAIL. The Avcc power domain 415 powers the double-tail latch quantizer 400, including a set of reset transistors P2 and P3. An input circuit 430 includes the tail transistor N0. Various distinct adaptable Avcc_tail power domains 410 may be configured to continuously and simultaneously reduce input referred RMS noise and offset voltage, reduce clock-to-q timing and reduce overall power consumption in various double-tail latch quantizers 400 over process, voltage and/or temperature.

The Avcc power domain 415 powers a main clock buffer 420. The main clock buffer 420 receives a clock (clk) and generates an intermediate clock (iclk). The main clock buffer 420 feeds the intermediate clock (iclk) to the tail clock buffer 405 and a clock buffer 425. The clock buffer 425 is powered by the Avcc power domain 415 and produces a clock signal (clk_p). The clk_p and the clk_p_tail are non-inverted relative to clk. The iclk is inverted relative to clk.

Figure 5:
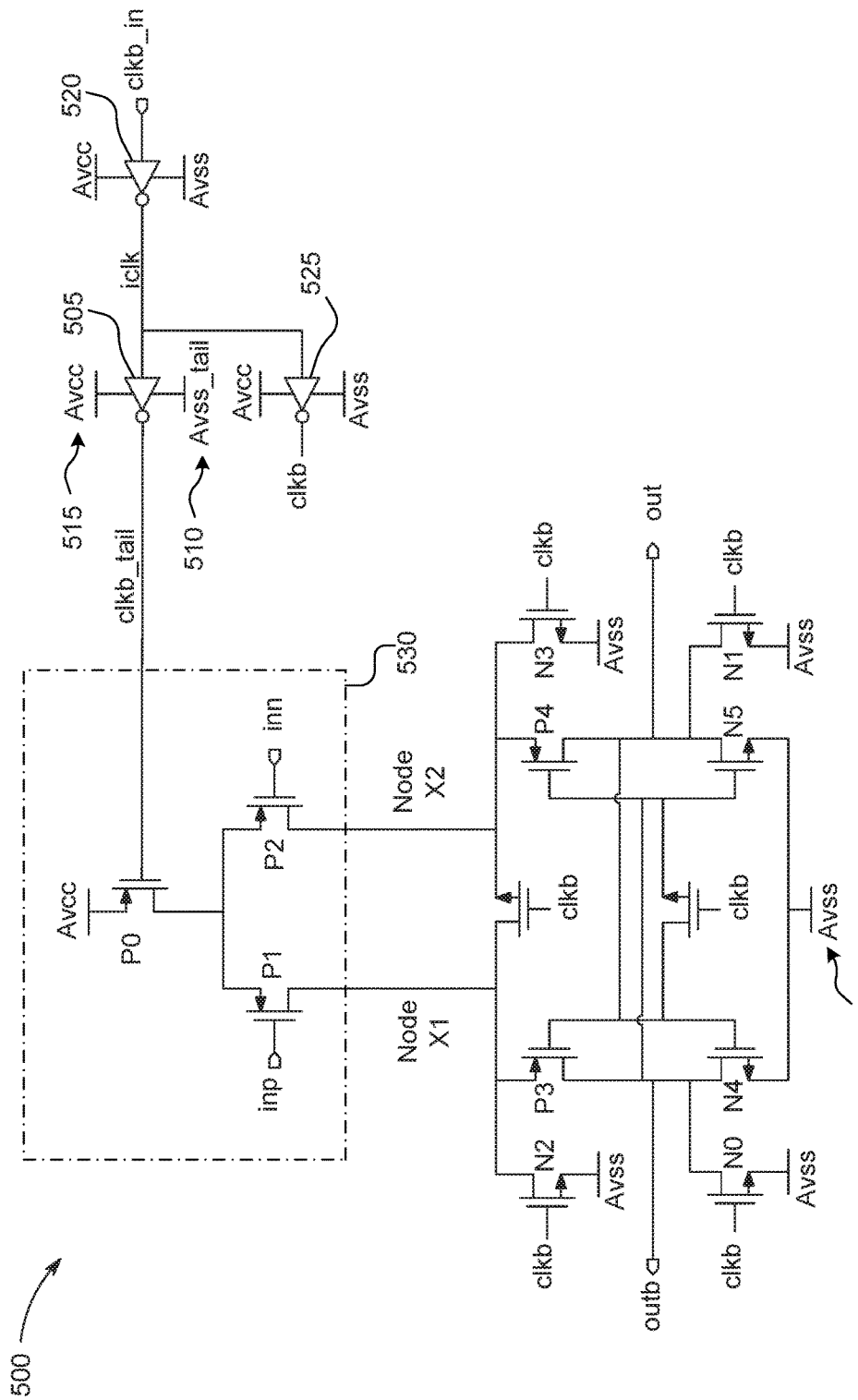
FIG. 5 depicts a schematic view of the exemplary circuit of FIG. 2A implemented with P-channel devices.

FIG. 5 depicts a schematic view of the exemplary circuit of FIG. 2A implemented with P-channel devices. A sense amplifier quantizer 500 includes a tail transistor P0. In various examples, the tail transistor P0 may be a tail device. An input circuit 530 includes the tail transistor P0. A tail clock buffer 505 produces a clock signal (clkb_tail), which controls the gate of the tail transistor P0. The tail clock buffer 505 is powered by an Avss_tail power domain 510 and an Avcc power domain 515. The current through an input circuit stage of the sense amplifier quantizer 500 may be controlled by the clkb_tail pulse amplitude, which is governed by the Avss_tail power domain 510. The Avss_tail power domain 510 is distinct from an Avss low supply domain 516. The Avss_tail power domain 510 may be referred to as VTAIL. The Avcc power domain 515 and the Avss low supply domain 516 power the sense amplifier quantizer 500. A set of reset transistors N0, N1, N2 and N3 are referenced to the Avss low supply domain 516.

The Avcc power domain 515 and the Avss low supply domain 516 power a main clock buffer 520. The main clock buffer 520 receives a clock (clkb_in) and generates an intermediate clock (iclk). The main clock buffer 520 is powered by the Avcc power domain 515 and the Avss low supply domain 516 and feeds the intermediate clock (iclk) to the tail clock buffer 505 and to a clock buffer 525. The clock buffer 525 is powered by the Avcc power domain 515 and the Avss low supply domain 516, receives the intermediate clock (iclk), and drives a clock signal (clkb). The clkb and the clkb_tail are non-inverted relative to clkb_in. The iclk is inverted relative to clkb_in.

Figure 6:
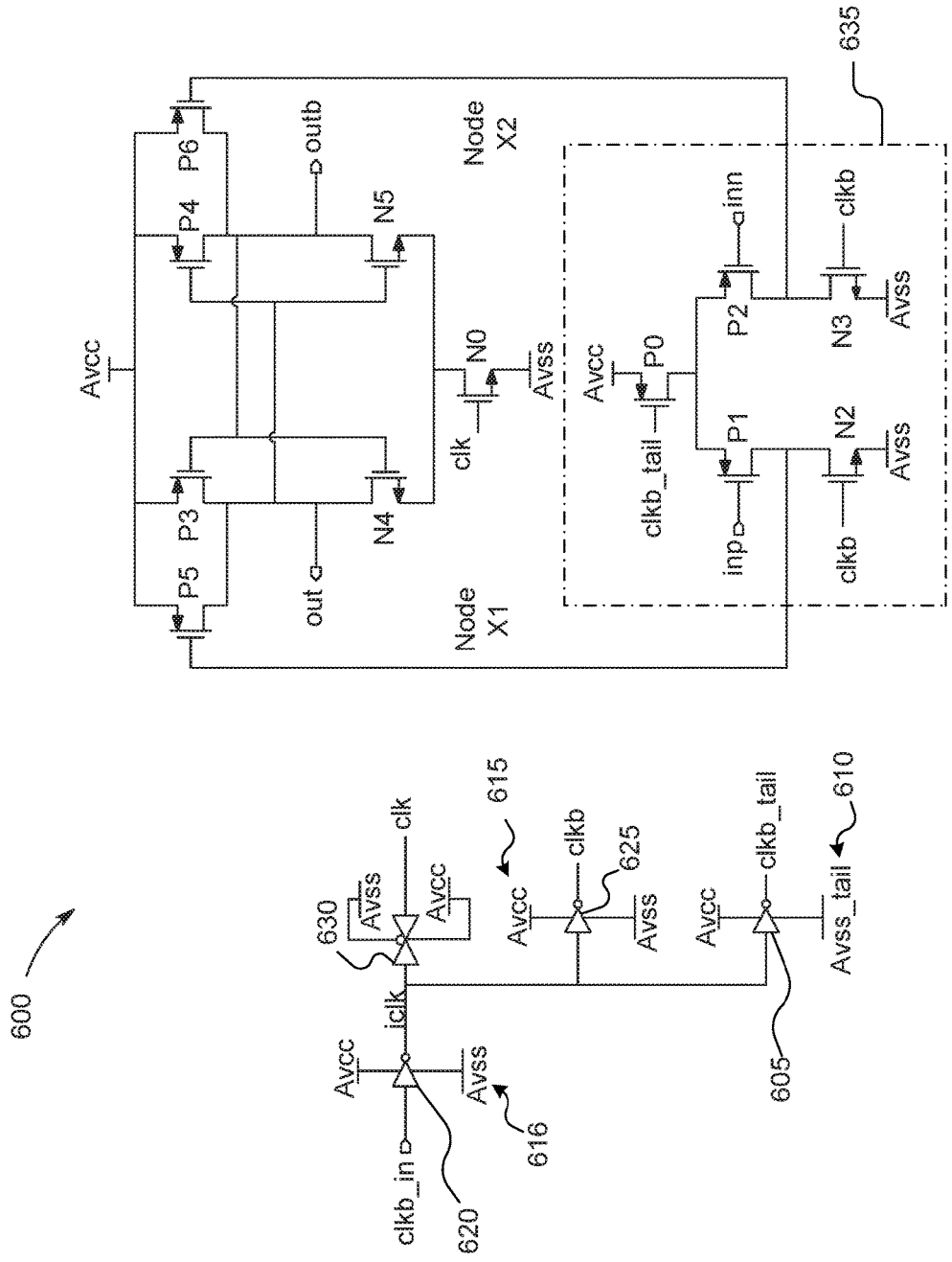
FIG. 6 depicts a schematic view of the exemplary circuit of FIG. 3 implemented with P-channel devices.

FIG. 6 depicts a schematic view of the exemplary circuit of FIG. 3 implemented with P-channel devices. A double-tail latch quantizer 600 includes a tail transistor P0. In various examples, the tail transistor P0 may be a tail device. An input circuit 635 includes the tail transistor P0. A tail clock buffer 605 produces a clock signal (clkb_tail), which controls the gate of the tail transistor P0. The tail clock buffer 605 is powered by an Avss_tail power domain 610 and by an Avcc power domain 615. The current through an input circuit stage of the double-tail latch quantizer 600 may be controlled by the clkb_tail pulse amplitude, which is governed by the Avss_tail power domain 610. The Avss_tail power domain 610 is distinct from an Avss low supply domain 616. The Avss_tail power domain 610 may be referred to as VTAIL. The Avcc power domain 615 and the Avss low supply domain 616 power the double-tail latch quantizer 600. The Avss low supply domain 616 powers a set of reset transistors N2 and N3.

The Avcc power domain 615 and the Avss low supply domain 616 power a main clock buffer 620. The main clock buffer 620 receives a clock (clkb_in) and generates an intermediate clock (iclk). The main clock buffer 620 is powered by the Avcc power domain 615 and feeds the intermediate clock (iclk) to the tail clock buffer 605, a clock buffer 625 and a TGATE 630. The clock buffer 625 is powered by the Avcc power domain 615 and drives a clock signal (clkb). The TGATE 630 produces a clock signal (clk). The TGATE 630 may operate as a continuous drive and may facilitate alignment of clkb to clk and clkb_tail. The clkb and the clkb_tail are non-inverted relative to clkb_in. The iclk and clk are inverted relative to clkb_in.

Figure 7:
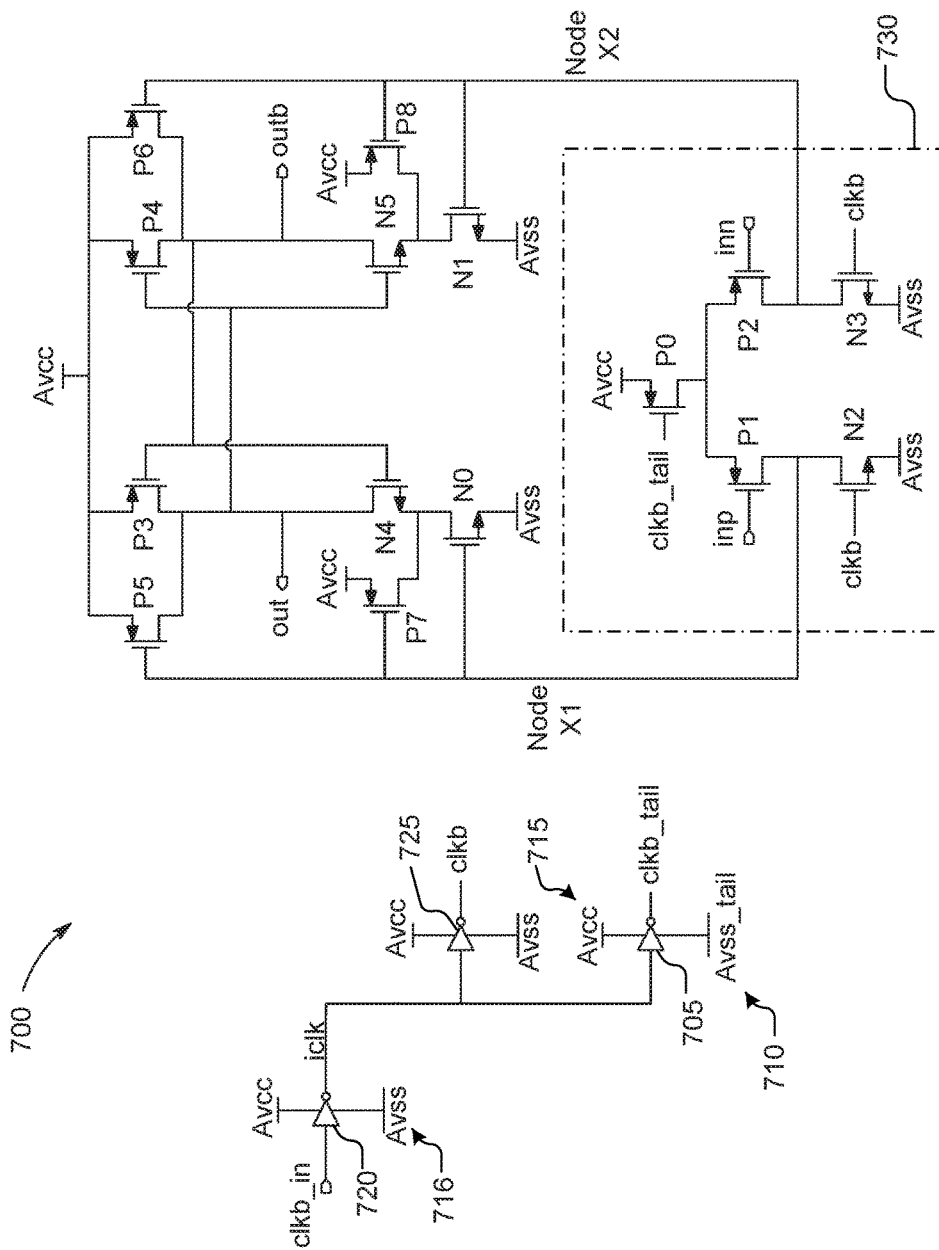
FIG. 7 depicts a schematic view of the exemplary circuit of FIG. 4 implemented with P-channel devices.

FIG. 7 depicts a schematic view of the exemplary circuit of FIG. 4 implemented with P-channel devices. A double-tail latch quantizer 700 includes a tail transistor P0. In various examples, the tail transistor P0 may be a tail device. An input circuit 730 includes the tail transistor P0. A tail clock buffer 705 produces a clock signal (clkb_tail), which controls the gate of the tail transistor P0. The tail clock buffer 705 is powered by an Avss_tail power domain 710 and by an Avcc power domain 715. The current through an input circuit stage of the double-tail latch quantizer 700 may be controlled by the clkb_tail pulse amplitude, which is governed by the Avss_tail power domain 710. The Avss_tail power domain 710 is distinct from an Avss low supply domain 716. The Avss_tail power domain 710 may be referred to as VTAIL. The Avcc power domain 715 and the Avss low supply domain 716 power the double-tail latch quantizer 700. The Avss low supply domain 716 powers a set of reset transistors N2 and N3.

The Avcc power domain 715 and the Avss low supply domain 716 power a main clock buffer 720. The main clock buffer 720 receives a clock (clkb_in) and generates an intermediate clock (iclk). The main clock buffer 720 feeds the intermediate clock (iclk) to the tail clock buffer 705 and to a clock buffer 725. The clock buffer 725 is powered by the Avcc power domain 715 and drives a clock signal (clkb). The clkb and the clkb_tail are non-inverted relative to clkb_in. The iclk is inverted relative to clkb_in.

Figure 8A:
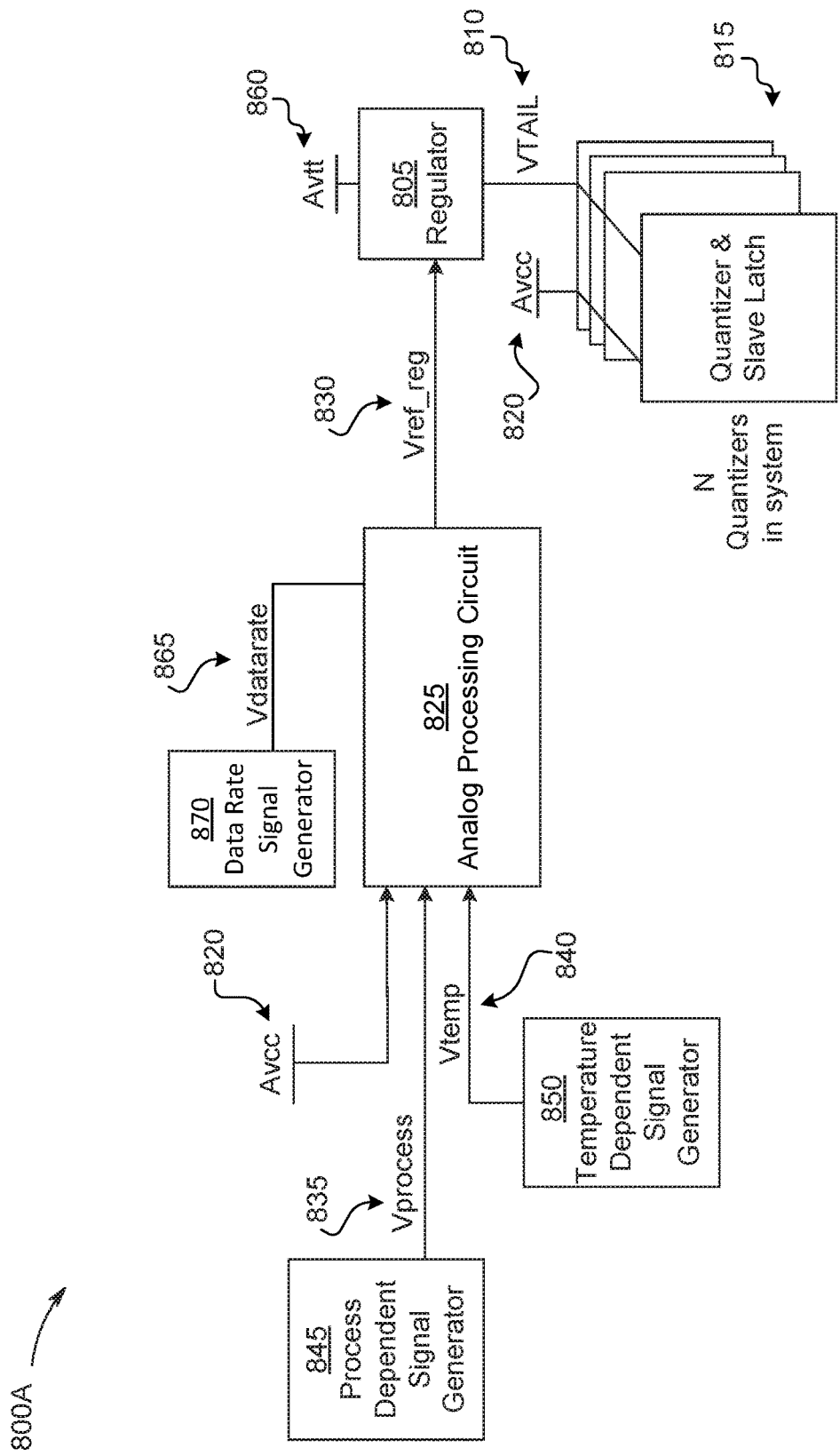
FIG. 8A depicts a block diagram view of an exemplary VTAIL analog control system for a quantizer circuit.

FIG. 8A depicts a block diagram view of an exemplary VTAIL analog control system for a quantizer circuit. VTAIL may refer to the magnitude of Avcc_tail and/or Avss_tail. A VTAIL analog control system 800A includes an adjustable regulator 805. The adjustable regulator 805 produces an adjustable VTAIL power domain 810. The VTAIL power domain 810 powers one or more tail devices in one or more quantizers 815. By way of example and not limitation, the quantizers 815 may include quantizers 200A, 200B, 300, 400, 500, 600 and/or 700. In some examples and as described with reference to FIGS. 5-7, corresponding circuit adjustment may be made to drive a low-side supply, Avss_tail, instead of or in combination with a high-side supply, Avcc_tail. The quantizers 815 are supplied a general Avcc power supply domain (Avcc) 820. In some implementations, the quantizers 815 may include a low side regulator, for example, to generate Avss and/or Avss_tail.

The adjustable regulator 805 is controlled by an analog processing circuit 825. The analog processing circuit 825 is configured to generate a control signal (Vref_reg) 830 as a function of a process signal (Vprocess) 835, the voltage supply signal (Avcc 820) and a temperature signal (Vtemp) 840. The combination of the process signal 835, the voltage supply signal (Avcc 820) and the temperature signal 840 may be referred to as a PVT monitor. Vref_reg 830 controls the adjustable regulator 805. The adjustable regulator 805 produces the adjustable VTAIL power domain 810 in response to and as a function of Vref_reg 830. The adjustable regulator 805 may drive the adjustable VTAIL power domain 810 to track Vref_reg 830 and produce a regulated voltage that is substantially equal, or at a predetermined offset and/or scaling factor, to Vref_reg 830. The adjustable regulator 805 may drive the adjustable VTAIL power domain 810 to produce a regulated voltage that is a function of Vref_reg 830. Accordingly, the analog processing circuit 825 controls the adjustable VTAIL power domain 810 as a function of PVT.

The process signal 835 is generated by a process dependent signal generator 845. The temperature signal 840 is generated by a temperature dependent signal generator 850. The general Avcc power supply domain (Avcc) 820 may be generated externally. In some examples, Avcc 820 may be generated by an Avcc supply regulator powered by a main supply Avtt 860. The analog processing circuit 825 receives a data rate signal 865 (Vdatarate). The data rate signal 865 is generated by a data rate dependent signal generator 870. In various examples, the analog processing circuit 825 may control the adjustable VTAIL power domain 810 in response to a combination of PVT and the data rate signal 865. By way of example and not limitation, the control signal (Vref_reg) 830 may be: Vref_reg=G4(f(data rate))*[G1(Avcc)+G2 (Vprocess)+G3(Vtemp)+Vshift]. In various implementations, G1, G2, G3 and G4 are gain factors, which may adjust for PVT sensitivities. In some implementations, Vshift may allow application targeting to minimize RMS noise and/or to minimize clock-to-q timing. In some implementations, the analog processing circuit 825 may be configured to allow the magnitude of the VTAIL power domain 810 to be lowered further in response to low data rates (from the data rate dependent signal generator 870) to further reduce input referred RMS noise and offset voltage. As depicted in the exemplary implementation of FIG. 8A, the data rate signal 865 (Vdatarate) may be used by the analog processing circuit 825 alone or in combination with PVT. Lowering the magnitude of the VTAIL power domain 810 may lower a clocking signal amplitude to various tail devices, which may lower RMS noise and input offset voltage. Lowering the magnitude of VTAIL power domain 810 may lower power consumption.

Figure 10:
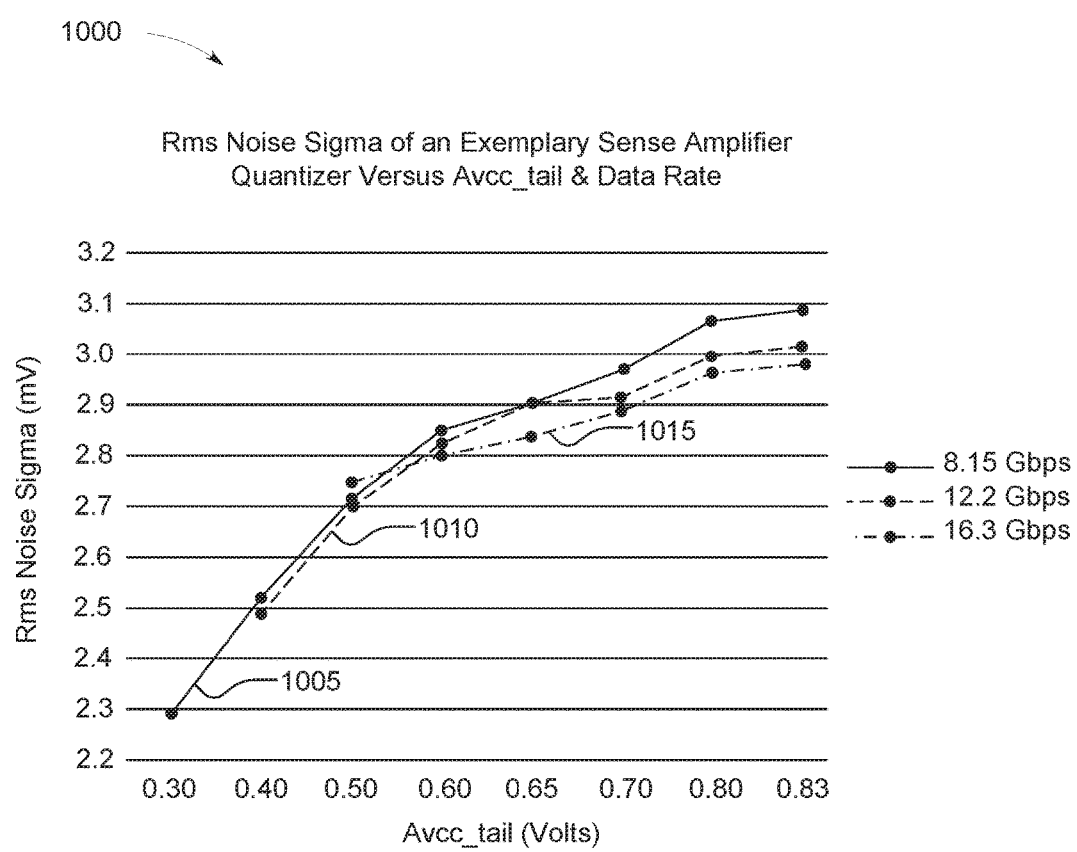
FIG. 10 depicts a chart view of RMS noise sigma versus Avcc_tail voltage and data rate for an exemplary sense amplifier quantizer.

Referring now to FIG. 10, RMS noise may generally increase for lower data rates. The range of noise improvement (e.g., less noise) is larger at lower data rates as the quantizer can function over a range of Avcc_tail voltages that includes even lower values of Avcc_tail than is possible at higher data rates. These lower values of Avcc_tail may lower tail current further, which may reduce power consumption further and may also reduce rms noise and offset voltage further. In various FPGA applications, the quantizer circuits may support both high and low data rate operations.

Various examples of data rate dependent signal generators 870 may generate the data rate signal 865. The generated data rate signal 865 may be, for example, a single analog voltage indicative of a single data rate. In some examples, the generated data rate signal 865 may be, for example, two or more analog voltages, indicative of, for example, two or more data rates. In various embodiments, the generated data rate signal 865 may be, for example, a data bus that is generated by logic. The data bus value may be set by a user or deduced by the logic, for example.

In some examples, a first control system for modulating a VTAIL power domain in response to a process dependent signal, an Avcc power domain signal and a temperature signal may include the analog processing circuit 825 (with its associated output, Vref_reg 830), an input configured to receive Avcc 820, the process dependent signal generator 845 (with its associated output, Vprocess 835), the temperature dependent signal generator 850 (with its associated output, Vtemp 840), and the adjustable regulator 805 (with its associated output, VTAIL 810). In various implementations, a second control system for modulating a VTAIL power domain in response to a received data rate signal may include the first control system and may further include the data rate dependent signal generator 870 (with its associated output, Vdatarate 865).

Each of the quantizers 815 may be a quantizer circuit (QC). The QCs may include one or more tail devices. In an illustrative example, the first control system may modulate a VTAIL power domain to increase a current through a plurality of tail devices when a process dependent signal indicates that a QC is operating at an operating point associated with slower than nominal transistor speed process (larger clock-to-q). In some examples, the first control system may modulate a VTAIL power domain to decrease a current through a plurality of tail devices when a process dependent signal indicates that a QC is operating at an operating point associated with faster than nominal transistor speed process (smaller clock-to-q), lowering RMS noise and input offset voltage.

Figure 8B:
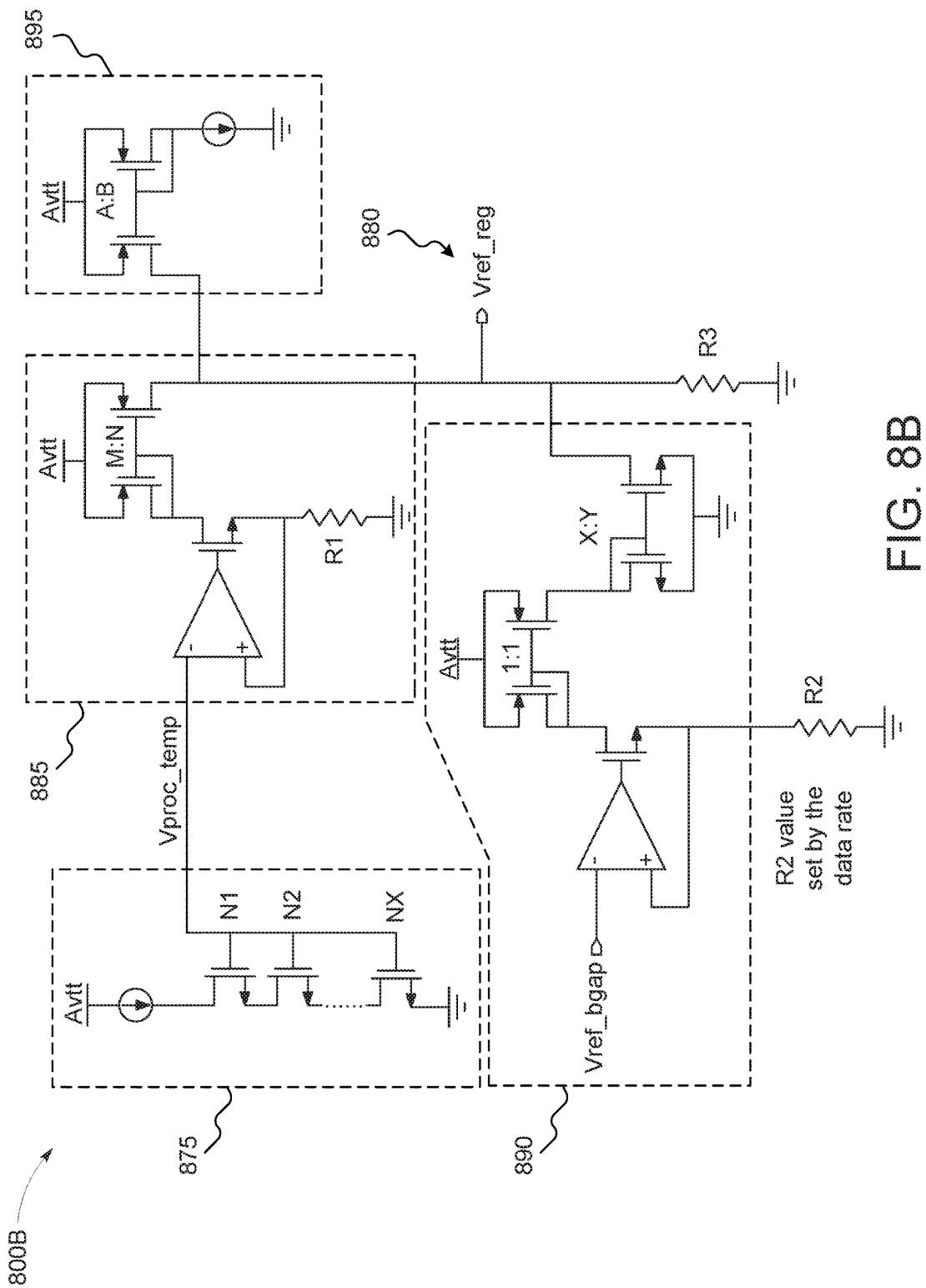
FIG. 8B depicts a schematic view of an exemplary process and temperature reference voltage generator for a VTAIL control system.

FIG. 8B depicts a schematic view of an exemplary process and temperature reference voltage generator for a VTAIL control system. By way of example and not limitation, the example of FIG. 8B depicts an implementation of a process and temperature signal generator and analog processing circuit (PTSG-APC) 800B. The PTSG-APC 800B may be, for example, coupled to the analog processing circuit 825. The PTSG-APC 800B may be, for example, the process dependent signal generator 845 in combination with the temperature dependent signal generator 850. The PTSG-APC 800B includes an exemplary process and temperature dependent subcircuit 875. The process and temperature dependent subcircuit 875 is described with reference to FIG. 9 of Hudner-2017. A resulting regulator control signal (Vref_reg) 880 may be a scaled and offset version of the process and temperature dependent subcircuit 875. The scaling may occur via a current mirror 885, and the offsetting may occur via a current source 890.

The PTSG-APC 800B includes a Ptat circuit 895. In some implementations, the Ptat circuit 895 may remove the effects of process from the temperature sensing, which may enable Vref_reg 880 to be a more controlled, programmable process and temperature sensor. For example, in some implementations, the Ptat voltage may be generated by various bandgap reference devices and provide deltaVbe=(kT/q)*ln(8). With reference to the process and temperature dependent subcircuit 875, a current is forced into a stack of X NMOS devices. The number of devices X, is chosen to set the required Vproc_temp. In some implementations, FinFet devices (nf=2) may give a Vproc_temp with a substantially neutral temperature coefficient. For example, a process only sensor may advantageously allow the Ptat circuit 895 control of temperature sensing.

In some low data rate modes of operation, where power consumption is desired to be low, the value of a resistor R2 may be programmed (automatically by circuit functions) to enable further reductions of Vref_reg 880 at low data rates. Reducing Vref_reg 880 may lower a magnitude of VTAIL, which may reduce RMS noise and input offset voltage, which may reduce overall power in various quantizer circuits (e.g., 200A, 200B, 300, 400, 500, 600 and/or 700) receiving low data rates. In some examples, and as described with reference to FIGS. 5-7, corresponding circuit adjustment may be made to drive a low-side supply, Avss_tail, in place of a high-side supply, Avcc_tail. In various examples, Vref_reg 880 (FIG. 8B) may be Vref_reg 830 (FIG. 8A).

Figure 9A:
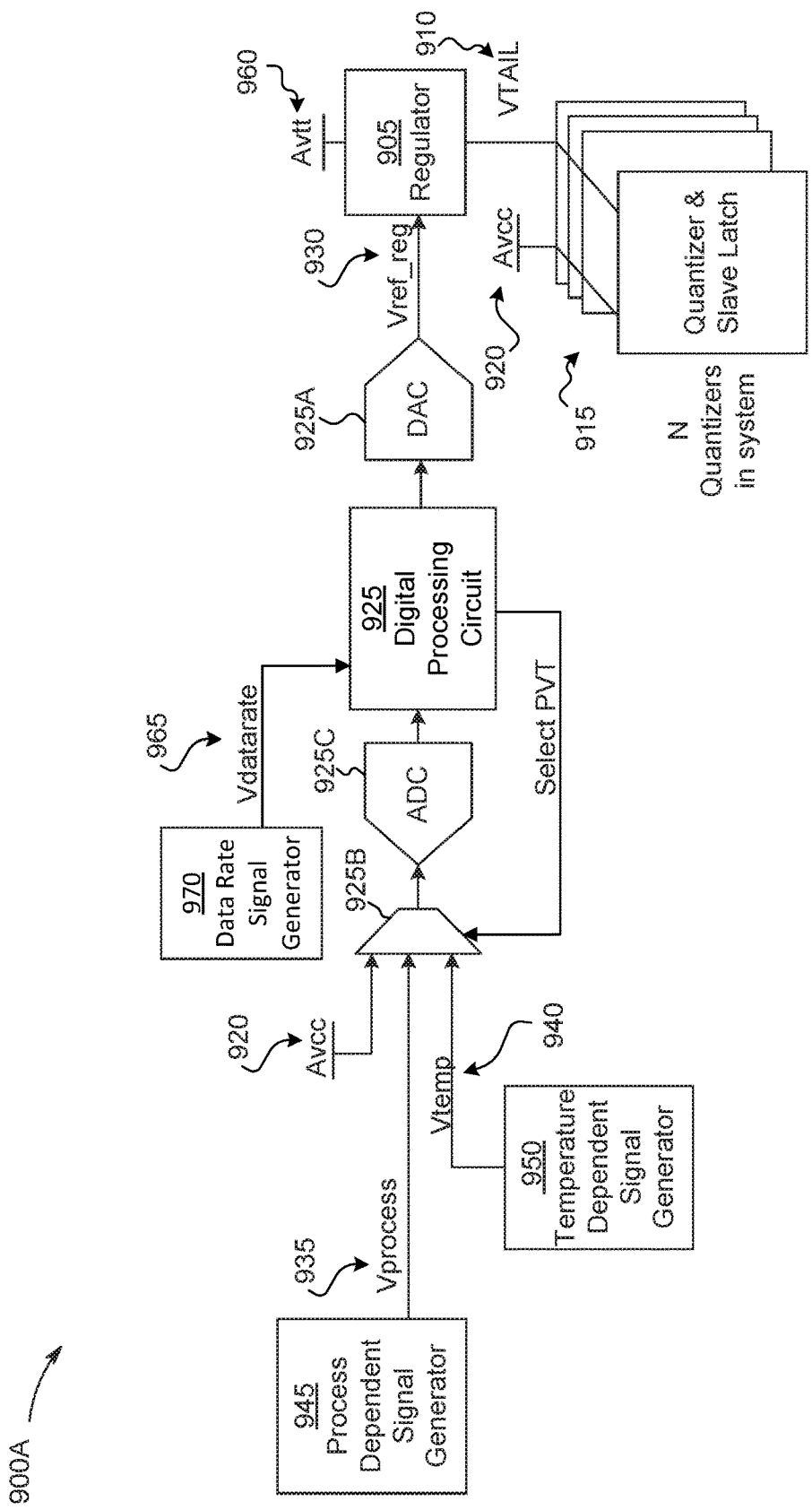
FIG. 9A depicts a block diagram view of an exemplary VTAIL digital control system for a quantizer circuit.

FIG. 9A depicts a block diagram view of an exemplary VTAIL voltage digital control system for a quantizer circuit. VTAIL may refer to the magnitude of Avcc_tail and/or Avss_tail. A VTAIL voltage digital control system 900A includes an adjustable regulator 905. The adjustable regulator 905 produces an adjustable VTAIL power domain 910. The adjustable VTAIL power domain 910 powers one or more tail devices in one or more quantizers 915. By way of example and not limitation, the quantizers 915 may include quantizers 200A, 200B, 300, 400, 500, 600 and/or 700. In some examples, and as described with reference to FIGS. 5-7, corresponding circuit adjustment may be made to drive a low-side supply, Avss_tail, in place of a high-side supply, Avcc_tail. The quantizers 915 are supplied a general Avcc power supply domain (Avcc) 920.

The adjustable regulator 905 is controlled by a digital processing circuit 925. The digital processing circuit 925 is configured to generate a control signal (Vref_reg) 930 via a digital to analog converter (DAC) 925A. The digital processing circuit 925 may, for example, include a processor operable to execute preprogrammed instructions and/or software. The digital processing circuit 925 is configured to receive a process signal (Vprocess) 935, the supply voltage signal (Avcc 920) and a temperature signal (Vtemp) 940. The combination of the process signal 935, the voltage supply signal (Avcc 920) and the temperature signal 940 may be referred to as a PVT monitor. PVT is received by the digital processing circuit 925 via a multiplexer 925B and an analog to digital converter (ADC) 925C. In various implementations, input elements of the PVT monitor may be sequentially selected by the multiplexer 925B for conversion by the ADC 925C. In some examples, the input elements of the PVT monitor may be converted in parallel by one or more ADCs, such as ADC 925C and may be received by the digital processing circuit 925 without an explicit multiplexer 925B. Accordingly, the digital processing circuit 925 controls the adjustable VTAIL power domain 910 in response to PVT.

The process signal 935 is generated by a process dependent signal generator 945. The temperature signal 940 is generated by a temperature dependent signal generator 950. The general Avcc power supply domain (Avcc) 920 may be generated externally. In some examples, Avcc 920 may be generated by an Avcc supply regulator powered by a main supply Avtt 960. The digital processing circuit 925 receives a data rate signal (Vdatarate) 965. The data rate signal 965 is generated by a data rate dependent signal generator 970. In various examples, the digital processing circuit 925 may control the adjustable VTAIL power domain 910 in response to a combination of PVT and the data rate signal 965. By way of example and not limitation, the control signal (Vref_reg) 930 may be: Vref_reg=G5 [G1(Avcc_code)+G2(Vprocess_code−Vprocess_code_nom)+G3(Vtemp_code−Vtemp_code_nom)+G4(Max_data_rate−Data_rate)+Vshift_code]. In various implementations, G1, G2, G3, G4 and G5 are gain factors, which may adjust for PVT sensitivities. In some implementations, Vshift may allow application targeting to minimize RMS noise, input offset voltage and/or clock-to-q timing. In some implementations, the digital processing circuit 925 may be configured to allow the magnitude of the adjustable VTAIL power domain 910 to be lowered further in response to low data rates (from the data rate dependent signal generator 970) to further reduce input referred RMS noise and offset voltage. As depicted in the exemplary implementation of FIG. 9A, the data rate signal 965 (Vdatarate) may be used by the digital processing circuit 925 alone or in combination with PVT. Lowering the magnitude of the VTAIL power domain 910 may lower a clocking signal amplitude to various tail devices, which may lower RMS noise and input offset voltage. Lowering the magnitude of the VTAIL power domain 910 may lower power consumption.

Various examples of data rate dependent signal generators 970 may generate the data rate signal 965. The generated data rate signal 965 may be, for example, a single analog voltage indicative of a single data rate. In some examples, the generated data rate signal 965 may be, for example, two or more analog voltages, indicative of, for example, two or more data rates. In various embodiments, the generated data rate signal 965 may be, for example, a data bus that is generated by logic. The data bus value may be set by a user or deduced by the logic, for example.

In some exemplary implementations, of the processing circuits 825, 925 may be configured to receive a digital bus input, such as Vdatarate 865, 965 from either another block in the FPGA or an external circuit. The processing circuits 825, 925 may be configured to program an analog element (e.g., programmable resistor) in response to or as a function of Vdatarate 865, 965. In some examples, an analog Vdatarate signal, such as Vdatarate 865, may be generated from a voltage-controlled oscillator (VCO) or a phase-locked loop (PLL) that locks onto the data rate. Accordingly, various frequency detection circuits may be included in some examples.

In some examples, a third control system for modulating a VTAIL power domain in response to a process dependent signal, an Avcc power domain signal and a temperature signal may include the digital processing circuit 925, the DAC 925A (with its associated output, Vref_reg 930), the ADC 925C, the multiplexer 925B, an input configured to receive Avcc 920, the process dependent signal generator 945 (with its associated output, Vprocess 935), the temperature dependent signal generator 950 (with its associated output, Vtemp 940), and the adjustable regulator 905 (with its associated output, VTAIL 910). In various implementations, a fourth control system for modulating a VTAIL power domain in response to a received data rate signal may include the third control system and may include the data rate dependent signal generator 970 (with its associated output, Vdatarate 965).

Each of the quantizers 915 may be a quantizer circuit (QC). The QCs may include one or more tail devices. In an illustrative example, the third control system may modulate a VTAIL power domain to increase a current through a plurality of tail devices when a process dependent signal indicates that a QC is operating at an operating point associated with slower than nominal transistor speed process (larger clock-to-q). Accordingly, the slower than nominal transistor speed process may be detected to improve clock-to-q performance.

In some examples, the third control system may modulate a VTAIL power domain to decrease a current through a plurality of tail devices when a process dependent signal indicates that a QC is operating at an operating point associated with faster than nominal transistor speed process (smaller clock-to-q). Accordingly, the faster than nominal transistor speed process may be detected to improve input referred RMS noise and input offset voltage.

Figure 9B:
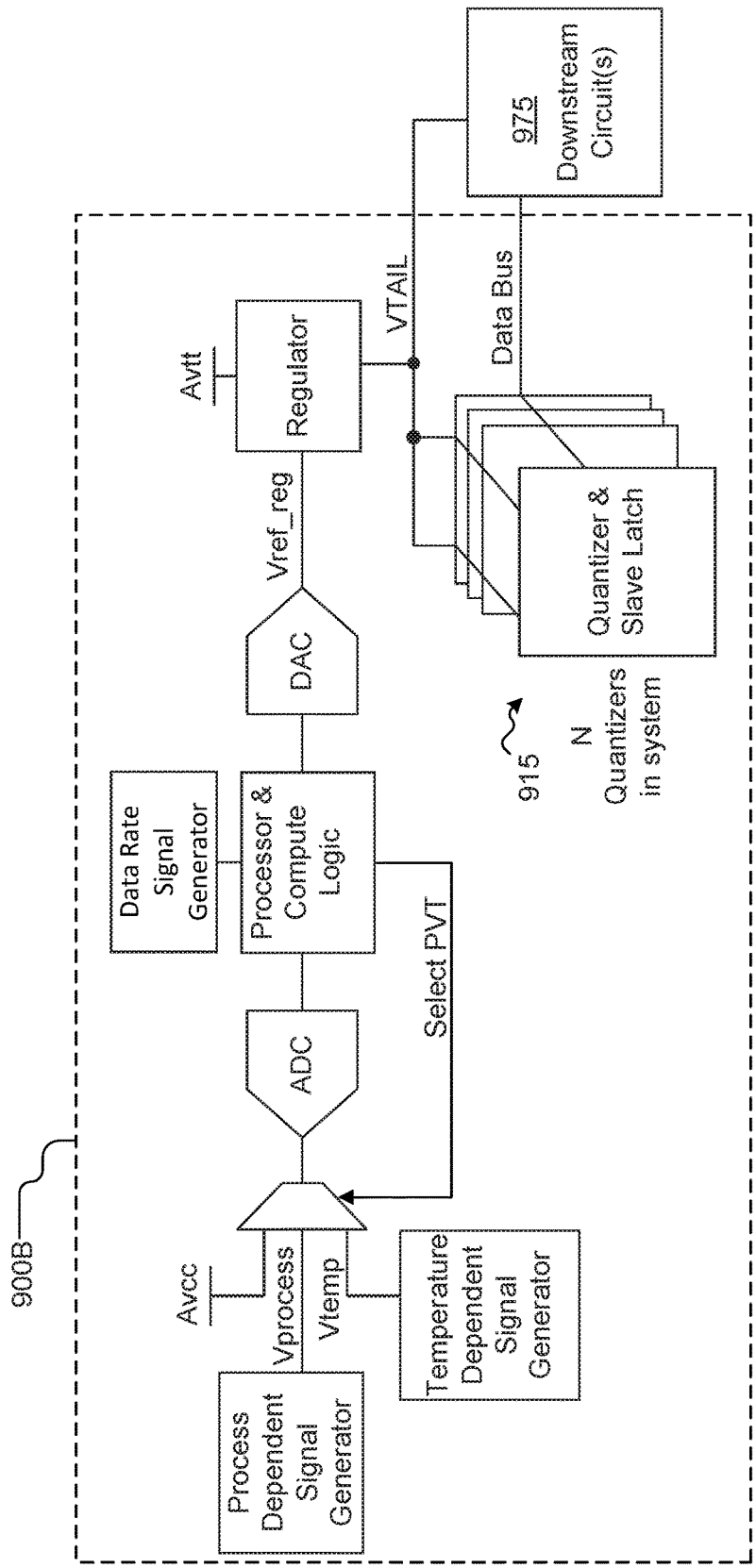
FIG. 9B depicts a block diagram view of the exemplary VTAIL digital control system of FIG. 9A with VTAIL configured to power the entire quantizer circuit and downstream circuits.

FIG. 9B depicts a block diagram view of the exemplary VTAIL voltage digital control system of FIG. 9A with VTAIL configured to power the entire quantizer circuit and downstream circuits. A VTAIL voltage digital control system 900B powers one or more quantizers 915, each entirely. In various embodiments, such as depicted in FIG. 9B, the VTAIL voltage digital control system 900B may be configured to power various downstream circuits 975 (e.g., slave latches, re-timing latches, logic in digital front-ends, deserializers). Powering downstream circuits 975 may advantageously reduce power, especially at substantially high data rates.

FIG. 10 depicts a chart view of RMS noise sigma versus Avcc_tail and data rate for an exemplary sense amplifier quantizer. An RMS noise chart 1000 of includes simulated RMS noise curves with respect to an Avcc_tail voltage. The RMS noise chart 1000 includes an 8.15 Gbps quantizer noise curve 1005, a 12.2 Gbps quantizer noise curve 1010, and a 16.3 Gbps quantizer noise curve 1015, where Gbps is gigabits-per-second data rate. As depicted, the RMS noise of various sense amplifier quantizers may be reduced by reducing the magnitude of the Avcc_tail voltage. RMS noise of various sense amplifier quantizers running at low data rates may be reduced by reducing the magnitude of the Avcc_tail voltage. By way of example and not limitation, further reduction of input referred RMS noise may be achieved at even lower data rates by lowering Avcc_tail further.

Reduction of the magnitude of the Avcc_tail voltage reduces overall operation current of various sense amplifier and double-tail quantizers by reducing the amplitude of a gating signal on tail devices. In various examples, similar charts may be generated versus Avss.

Figure 11:
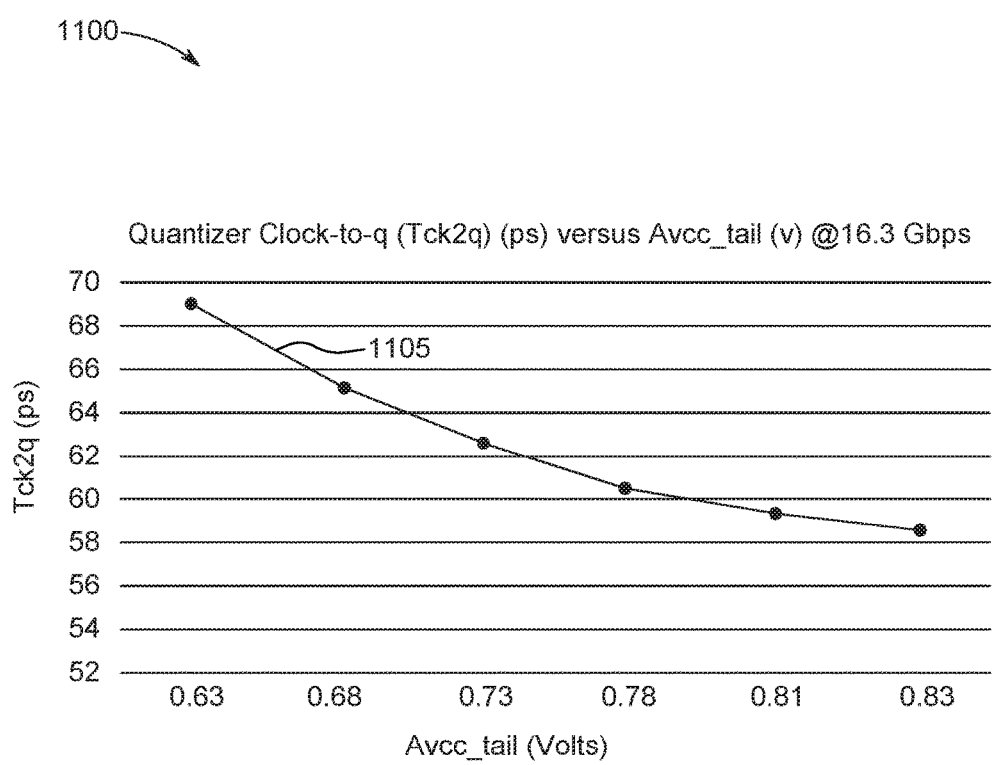
FIG. 11 depicts a chart view of clock-to-q delay versus Avcc_tail for an exemplary quantizer.

FIG. 11 depicts a chart view of clock-to-q delay versus Avcc_tail voltage for an exemplary quantizer. A clock-to-q chart 1100 includes a simulated clock-to-q curve 1105 with respect to an Avcc_tail voltage for a 16.3 Gbps quantizer. As depicted, the clock-to-q time of various quantizers may be reduced by increasing the magnitude of Avcc_tail. In some examples, quantizers may reside on a fast transistor speed process (TSP) portion of a semiconductor wafer, where input referred RMS noise and offset voltage is high and clock-to-q is low. Such quantizers, though consuming more power from being in the fast TSP, may also have the magnitude of their Avcc_tail voltage reduced, which may trade their surplus speed performance for lower input referred RMS noise and offset voltage and lower power. Conversely, in some examples, quantizers may reside on a slow TSP portion of a semiconductor wafer. Such quantizers may be inherently lower power and lower input referred RMS noise. These quantizers may have the magnitude of their Avcc_tail voltage increased, which may trade their surplus noise and power performance for lower clock-to-q. In some examples, the wafer may be a substrate. In various examples, similar charts may be generated versus Avss.

Figure 12A:
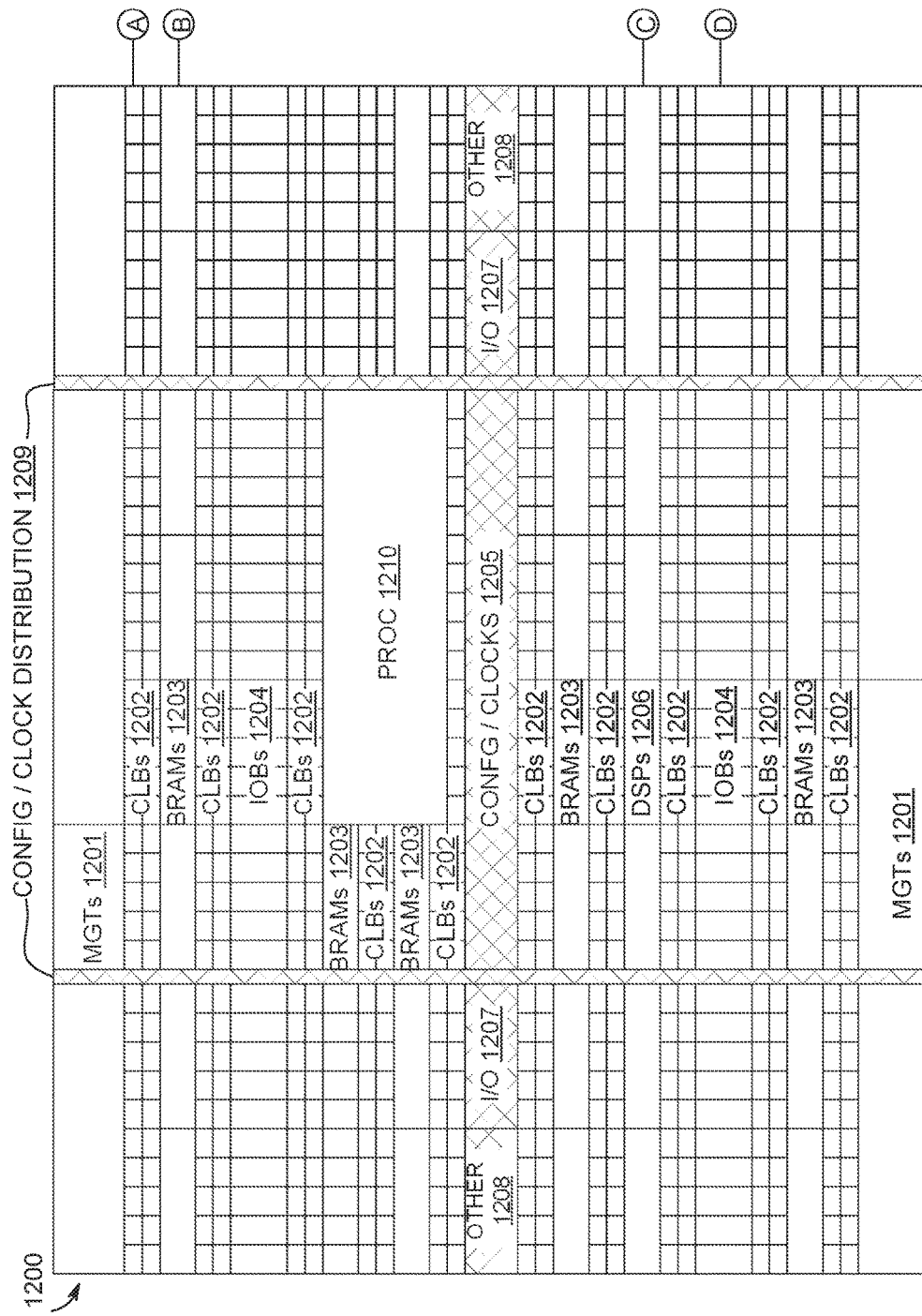
FIGS. 12A and 12B depict an exemplary programmable integrated circuit (IC) on which the disclosed circuits and processes may be implemented.
Figure 12B:
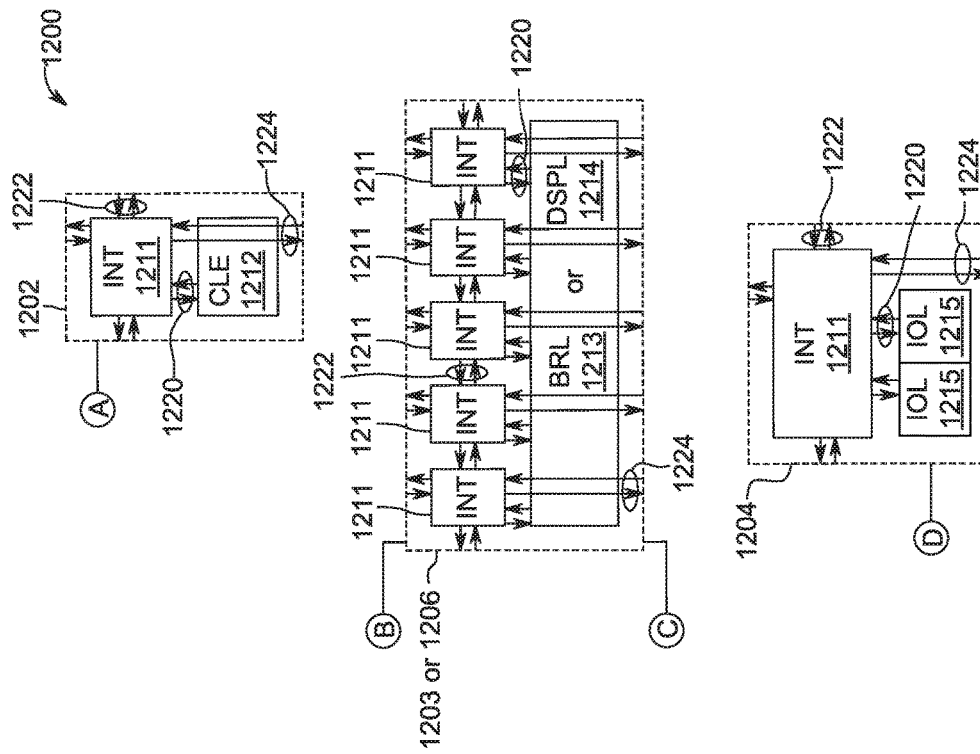

FIGS. 12A and 12B depict an exemplary programmable integrated circuit (IC) on which the disclosed circuits and processes may be implemented. FIGS. 12A and 12B will be described in combination. The connections between FIGS. 12A and 12B are depicted as circle points A, B, C and D. A programmable IC 1200 includes field programmable gate array (FPGA) logic. The programmable IC 1200 may be implemented with various programmable resources and may be referred to as a System on Chip (SOC). FPGA logic may include several diverse types of programmable logic blocks in the array.

For example, FIG. 12A and FIG. 12B illustrate a programmable IC 1200 that includes a large number of different programmable tiles including multi-gigabit transceivers (MGTs) 1201, configurable logic blocks (CLBs) 1202, blocks of random access memory (BRAMs) 1203, input/output blocks (IOBs) 1204, configuration and clocking logic (CONFIG/CLOCKS) 1205, digital signal processing blocks (DSPs) 1206, specialized input/output blocks (I/O) 1207 (e.g., clock ports), and other programmable logic 1208 (e.g., digital clock managers, analog-to-digital converters, system monitoring logic). The programmable IC 1200 includes dedicated processor blocks (PROC) 1210. The programmable IC 1200 may include internal and external reconfiguration ports (not shown).

In various examples, a serializer/deserializer may be implemented using the MGTs 1201. The MGTs 1201 may include various data serializers and deserializers. Data serializers may include various multiplexer implementations. Data deserializers may include various demultiplexer implementations.

In some examples of FPGA logic, each programmable tile includes a programmable interconnect element (INT) 1211 having standardized inter-connections 1224 to and from a corresponding interconnect element in each adjacent tile. Therefore, the programmable interconnect elements taken together implement the programmable interconnect structure for the illustrated FPGA logic. The programmable interconnect element INT 1211 includes the intra-connections 1220 to and from the programmable logic element within the same tile, as shown by the examples included in FIG. 12B. The programmable interconnect element INT 1211 includes the inter-INT-connections 1222 to and from the programmable interconnect element INT 1211 within the same tile, as shown by the examples included in FIG. 12B.

For example, a CLB 1202 may include a configurable logic element (CLE) 1212 that may be programmed to implement user logic, plus a single programmable interconnect element INT 1211. A BRAM 1203 may include a BRAM logic element (BRL) 1213 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 1206 may include a DSP logic element (DSPL) 1214 and one or more programmable interconnect elements. An IOB 1204 may include, for example, two instances of an input/output logic element (IOL) 1215 and one instance of the programmable interconnect element INT 1211. The actual I/O bond pads connected, for example, to the I/O logic element 1215, may be manufactured using metal layered above the various illustrated logic blocks, and may not be confined to the area of the input/output logic element 1215.

In the pictured implementation, a columnar area near the center of the die (shown shaded in FIG. 12A) is used for configuration, clock, and other control logic. Horizontal areas 1209 extending from the column distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 12A and FIG. 12B include additional logic blocks that disrupt the regular columnar structure making up a large part of the programmable IC. The additional logic blocks may be programmable blocks and/or dedicated logic. For example, the processor block PROC 1210 shown in FIG. 12A spans several columns of CLBs 1202 and BRAMs 1203.

Note that FIG. 12A and FIG. 12B are intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 1202 may be included wherever the CLBs 1202 appear, to facilitate the efficient implementation of user logic.

Figure 13:
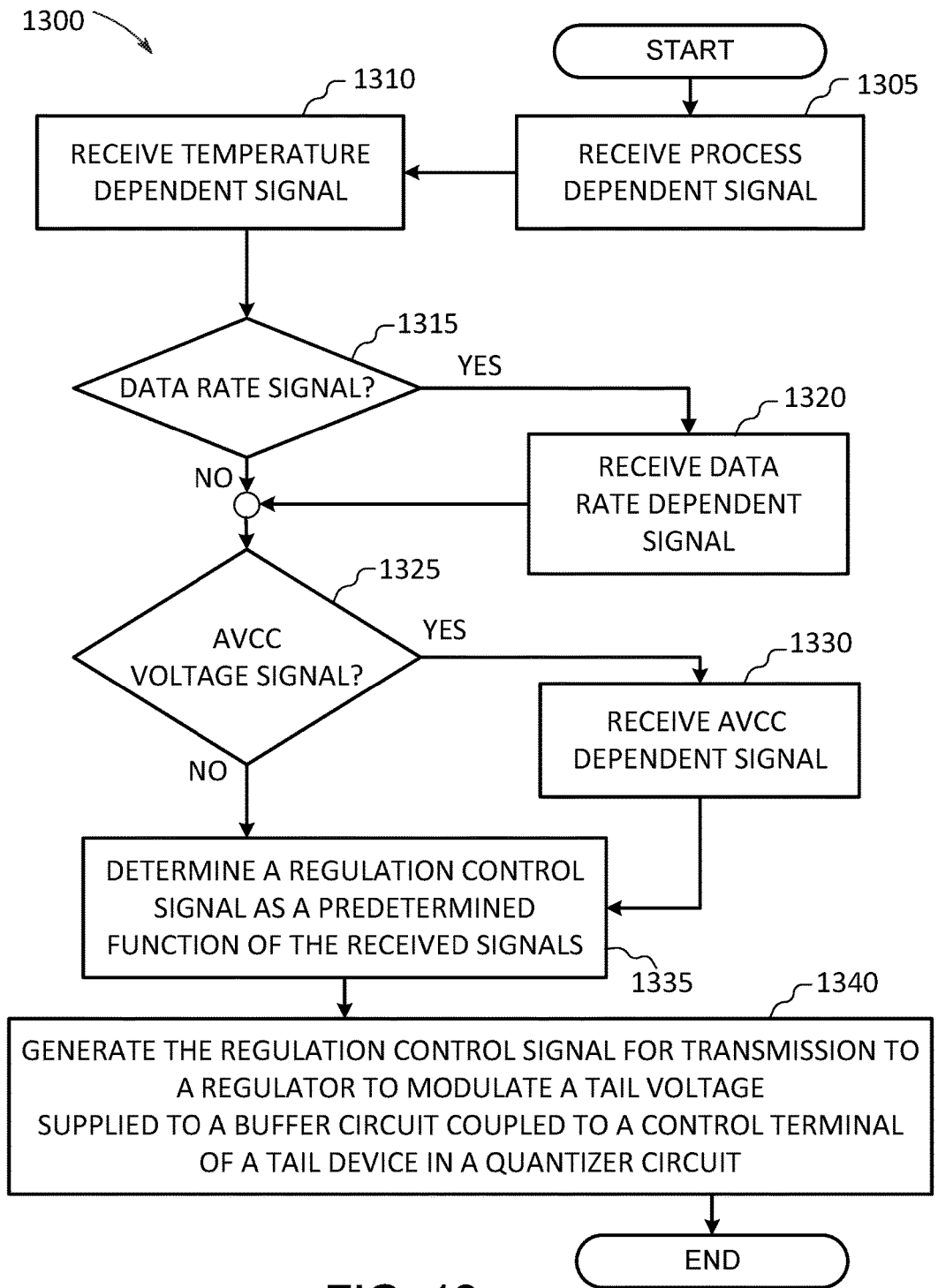
FIG. 13 depicts a flowchart of an exemplary method to compensate performance of a power source of a quantizer circuit.

FIG. 13 depicts a flowchart of an exemplary method to compensate performance of a power source of a quantizer circuit. The depicted exemplary process flow may be executed by a processor such as a processor that may be included in the analog processing circuit 825 (FIG. 8A). The processor may execute the depicted process step in hardware and/or software. Various examples of hardware may include field programmable gate arrays (FPGAs), application specific integrated circuits (ASICs) and/or microcontrollers. The processor may receive various inputs such as a process dependent signal. Various examples of process dependent signals may include Vprocess 835 (FIG. 8A). The processor may receive a temperature dependent signal. Various examples of temperature dependent signals may include Vtemp 840 (FIG. 8A). The processor may receive a voltage signal. Various examples of voltage signals may include Avcc 820 (FIG. 8A). The processor may receive a data rate signal. Various examples of data rate signals may include Vdatarate 865 (FIG. 8A). The processor may generate various outputs such as an analog reference voltage signal. Various examples of analog reference voltage signals may include Vref_reg 830 (FIG. 8A). The output analog reference voltage signal may be a control input to a regulator, such as the adjustable regulator 805. In response to the analog reference voltage signal, the regulator may generate a tail voltage supply, such as the VTAIL power domain 810.

Referring now to FIG. 13, the depicted process steps 1300 begin at process step 1305. At process step 1305, the processor receives a process dependent signal. Execution continues to process step 1310, where the processor receives a temperature dependent signal. Execution continues to process step 1315, where the processor determines the activity on a data rate signal input. If the data rate signal is active, then the processor receives the data rate dependent signal at process step 1320 and then continues to process step 1325. If the data rate signal is not active, then execution continues to process step 1325.

At process step 1325, the processor determines the activity on a voltage signal input, such as Avcc in the depicted example. If the voltage signal is active, then the processor receives the voltage signal at process step 1330 and then continues to process step 1335. If the voltage signal is not active, then execution continues to process step 1335.

At process step 1335 the processor determines a regulation control signal as a predetermined function of the received signals in process steps 1305 and 1310. The function may include the received signals in process steps 1320 and 1330. Execution continues to process step 1340.

At process step 1340 the processor generates the regulation control signal for transmission. The regulation control signal may be operably coupled to an adjustable regulator, such as the adjustable regulator 805 (FIG. 8A). The adjustable regulator may modulate a tail voltage, such as the VTAIL power domain 810 (FIG. 8A) as a function of the regulation control signal. The tail voltage may be supplied to a buffer circuit coupled to a control terminal of a tail device of a quantizer circuit. In some examples, the buffer circuit may be a driver circuit and may buffer a clock signal, with an amplitude that is a function of VTAIL, to a control terminal of one or more tail devices, such as tail transistor 205 (FIG. 2). The tail device(s) may be included in various quantizer circuits. Accordingly, the processor may adjust VTAIL continuously to optimize noise, offset and speed performance with low power consumption in various quantizer circuits over process, voltage and/or temperature.

Although various embodiments have been described with reference to the figures, other embodiments are possible. For example, in some embodiments, a continuous time quantizer, such as the CML topology may employ the tail circuits described. In some implementations, Avcc_tail may be adjusted to be lower than the magnitude of Avcc, to reduce input referred RMS noise. Accordingly, in some implementations, the Avss_tail magnitude may be adjusted to be less negative than the magnitude of Avss, to reduce input referred RMS noise. In an illustrative example, if VTAIL is used in the description, then magnitude is the pertinent quantity. However, for Avss_tail (or Avcc_tail)3, then sign is also pertinent. In an Avss_tail application, for example, the sign may be opposite compared to Avcc_tail. In both cases, lowering current may substantially reduce rms noise. In Avcc_tail applications, for example, lower current may be achieved by lowering Avcc_tail (e.g., to a value less than the corresponding Avcc value). Similarly, in Avss_tail applications, reduced rms noise, for example, may be achieved by increasing Avss_tail (e.g., to a value greater than the corresponding Avss). In various Avss_tail applications, the tail device may be Pmos and thus increasing Avss_tail reduces the Pmos tail device Vgs which may yield reduced current.

In various examples, raising VTAIL magnitude increases the amplitude of a gating signal on one or more tail devices, which may advantageously lower clock-to-q performance of various quantizer circuits. In various examples, lowering VTAIL magnitude decreases the amplitude of a gating signal on one or more tail devices which may advantageously lower RMS noise, offset voltage and power performance of various quantizer circuits.

In some examples, quantizers may refer to slicers. Slicers may include various tail devices that may be driven with clock signals of varying amplitudes to produce the advantages given for quantizers. In some examples, quantizers may refer to comparators. Various comparators may include tail devices, which may be driven as described in the exemplary quantizers. Comparators, as may be implemented in various analog to digital converters (ADCs), for example, and may receive the same benefits as described for the exemplary quantizers.

In some examples, the transistor speed process (TSP) may be inversely proportional to clock-to-q transistor speed process (TSP). In some embodiments, the NMOS input pairs depicted in the various circuit schematics may be implemented with PMOS devices along with the translational implementations, such as reset transistors translating from Avcc to ground or from Avcc to Avss. PMOS implementation of the input pairs may advantageously accept higher input common mode voltages. In various examples, the various system clocks in the depicted examples may be generated external to the described embodiments.

In various implementations, the magnitude of Avcc_tail or Avss_tail (which may be referred to generally as VTAIL) may be adjusted to a value less than or greater than the magnitude of Avcc or Avss, respectively. In positive voltage supply implementations that employ Avcc, a magnitude of Avcc_tail may be adjusted to a value less than the magnitude of Avcc, which may advantageously reduce input referred noise and input referred offset voltage. The magnitude of Avcc_tail may be adjusted to a value greater than the magnitude of Avcc, which may advantageously improve, for example, quantizer timing. In negative voltage supply implementations that employ Avss, a magnitude of Avss_tail may be adjusted to a value less than the magnitude of Avss (i.e., Avss_tail voltage is less negative than Avss), which may advantageously reduce input referred noise and input referred offset voltage. The magnitude of Avss_tail may be adjusted to a value greater than the magnitude of Avss (i.e., Avss_tail voltage is more negative than Avss), which may advantageously improve, for example, quantizer timing. In various embodiments, signal level shifting may be implemented, for example, to interface the resulting circuits employing VTAIL voltages unequal to Avcc or Avss with various quantizers or downstream circuits.

In some embodiments, various VTAIL supply circuits may be configured to track a combination of process voltage and temperature (PVT) to detect various PVT corners. Accordingly, various PVT corner detection circuits may be implemented to reduce input referred RMS noise, to reduce input referred offset voltage and to improve clock-to-q timing.

In some examples, the magnitude of VTAIL may be configured to exceed the magnitude of Avcc at some PVT corners, which may advantageously improve timing. In some examples, Avcc_tail magnitude increases may be limited to the magnitude of Avcc, which may substantially avoid or eliminate high speed level shift circuits, for example, those that may have been implemented with the clock buffers 210, 245, 305, and 405. In some implementations, Avss_tail magnitude may be limited to a range that is bounded by the magnitude of Avss (i.e., voltage in a range from zero to a negative supply voltage, Avss), which may substantially avoid or eliminate high speed level shift circuits, for example, those that may have been implemented with the clock buffers 505, 605 and 705.

In some examples, various methods for implementation of the transistor switches shown in the diagrams may be employed. The transistor switch implementations are therefore considered peripheral to the core concepts presented herein.

In various examples, the functions shown as N-channel designs may be implemented with P-channel devices. Conversely, the functions shown as P-channel designs may be employed with N-channel devices. Further, input signals and output signals for the complementary designs may function inversely.

In some embodiments, modules may include a collection of circuits organized and arranged to perform at least one predetermined function, and may involve both hardware and software elements. Various examples of modules may be implemented using circuitry, including various electronic hardware. By way of example and not limitation, the hardware may include transistors, resistors, capacitors, switches, integrated or hybrid circuits, alone or in combination with one or more other modules. In various examples, a module may include analog and/or digital logic, discrete components, traces and/or memory circuits fabricated on a substrate (e.g., silicon) including various integrated circuits which may include, by way of example and without limitation, re-programmable and programmed fabrics (e.g., PALs, FPGAs, ASICs). In some embodiments, the module(s) may involve execution of preprogrammed instructions and/or software, which may be stored in a data store where it is available to be retrieved for execution by a processor (e.g., microprocessor, microcontroller, DSP). Various examples of buffers may include drivers.

In an exemplary aspect, a power source module may compensate performance of a quantizer circuit. The power source module may include, for example, a processor operable to execute preprogrammed instructions and/or software. The power source module may include a voltage regulator. The voltage regulator may include an input terminal and an output terminal. In operation, the voltage regulator may be operable to supply an Avcc_tail voltage to the output terminal as a function of a regulation control signal applied to the input terminal. The output terminal may be operably coupled to supply operating power to a driver circuit configured to buffer a clock signal. The buffered clock signal may be coupled to one or more selected control terminals of a selected tail device in a quantizer circuit (QC). The selected tail device may be configured to enable or disable operating current through the QC in response to the buffered clock signal. The buffered clock signal may have an amplitude that may be a function of the Avcc_tail voltage. The QC may include a regeneration circuit. The regeneration circuit may be configured to receive operating power from an Avcc power domain.

The power source module may include a process sensor configured to generate a process dependent signal indicative of a timing performance of one or more devices in the QC embodied on a semiconductor substrate. The power source module may include a temperature sensor configured to generate a temperature signal indicative of a temperature of the devices in the QC. The power source module may include a compensation processor. The compensation processor may be operatively coupled to the process sensor and the temperature sensor and may be configured to generate the regulation control signal as a function of the process dependent signal and the temperature signal. The generated regulation control signal may be operatively coupled to the input terminal of the voltage regulator, and the compensation processor may be configured to modulate the Avcc_tail voltage in response to the process dependent signal and the temperature signal. In various embodiments, the Avcc_tail power domain may be independently regulatable relative to the Avcc power domain.

In various examples, the Avcc_tail power domain may be directly coupled to the Avcc power domain, such that all of the operating power supplied to the QC may be received from the output terminal of the voltage regulator. The QC may be operatively coupled to supply a data signal to a downstream circuit. The downstream circuit may be coupled to Avcc_tail to receive operating power.

Some implementations may include a voltage signal indicative of a voltage supply (powering a regeneration circuit) from which the voltage regulator may derive VTAIL. In some implementations, VTAIL may power the regeneration circuit. The compensation processor may be operatively coupled to receive the voltage signal configured to generate the regulation control signal as a function of the received voltage signal. The compensation processor may be configured to modulate VTAIL in response to the received voltage signal.

Various implementations may include a data rate signal indicative of a data rate from which the voltage regulator derives Avcc_tail. The compensation processor may be operatively coupled to receive the data rate signal configured to generate the regulation control signal as a function of the received data rate signal. The compensation processor may be configured to modulate the Avcc_tail voltage in response to the received data rate signal.

The compensation processor may be configured to modulate the Avcc_tail voltage to increase a current through the selected tail device when the process dependent signal indicates that the QC may be operating at an operating point associated with slower than nominal transistor speed process. Further, the compensation processor may be configured to modulate the Avcc_tail voltage to decrease a current through the selected tail device when the process dependent signal indicates that the QC may be operating at an operating point associated with faster than nominal transistor speed process.

In various examples, the QC may include an input circuit coupled to the regeneration circuit. The QC may be configured to receive an input signal. In various examples, the input signal may be a differential pair. In some implementations, the QC may include offset correction circuitry.

In an exemplary aspect, a quantizer circuit may include a power source module operable to compensate the performance of a quantizer circuit (QC). The power source module may include a process sensor configured to generate a process dependent signal indicative of a timing performance of a plurality of devices in the QC embodied on a semiconductor substrate. The power source module may include a temperature sensor configured to generate a temperature signal indicative of a temperature of the devices in the QC.

The quantizer circuit may include a regeneration circuit configured to receive operating power from an Avcc power domain. The quantizer circuit may include a plurality of tail devices configured to modulate current through the QC in response to a buffered clock signal. The quantizer circuit may include a plurality of tail devices configured to modulate current through the input circuit stage of the QC in response to a buffered clock signal. The buffered clock signal may be generated by a clock buffer operably connected to and powered by an Avcc_tail power domain. The quantizer circuit may include a module for modulating the Avcc_tail power domain in response to the process dependent signal, the Avcc power domain signal and the temperature signal.

In various embodiments, the quantizer circuit may include a data rate signal indicative of a data rate. The modulation module may modulate the Avcc_tail power domain in response to the received data rate signal. The modulating module may modulate the Avcc_tail power domain to increase a current through one or more tail devices when the process dependent signal indicates that the QC may be operating at an operating point associated with slower than nominal transistor speed process.

The modulating module may modulate the Avcc_tail power domain to decrease the current through one or more tail devices when the process dependent signal indicates that the QC may be operating at an operating point associated with faster than nominal transistor speed process.

In an exemplary aspect, a power source module may compensate performance of a quantizer circuit. The power source module may include a voltage regulator. The voltage regulator may have an input terminal and an output terminal. In operation, the voltage regulator may be operable to supply a tail voltage to the output terminal as a function of a regulation control signal applied to the input terminal. The output terminal may be operably connected to supply operating power to a driver circuit configured to buffer a clock signal to a control terminal of a tail device in a quantizer circuit (QC). The tail device may be configured to enable or disable operating current through the QC in response to the buffered clock signal. The buffered clock signal may have an amplitude that may be a function of the tail voltage. The QC may include a regeneration circuit configured to receive operating power from an Avcc power domain.

The power source module may include a process sensor configured to generate a process dependent signal indicative of a timing performance of a plurality of devices in the QC embodied on a semiconductor substrate. The power source module may include a temperature sensor configured to generate a temperature signal indicative of a temperature of the plurality of devices in the QC. The power source module may include a compensation processor operatively coupled to the process sensor and the temperature sensor. The power source module may be configured to generate the regulation control signal as a function of the process dependent signal and the temperature signal. The compensation processor may be configured to modulate the tail voltage in response to the process dependent signal and the temperature signal. In various embodiments, the tail voltage may be independently regulatable relative to the Avcc power domain.

The tail voltage may be directly coupled to the Avcc power domain such that substantially all of the operating power supplied to the QC may be received from the output terminal of the voltage regulator. The tail device may include a first tail device and a second tail device. The QC may include an input circuit coupled to the regeneration circuit and may be configured to receive an input signal. The QC may include offset correction circuitry. The QC may be operatively coupled to supply a data signal to a downstream circuit. The downstream circuit may be coupled to the tail voltage to receive operating power.

In some implementations, the power source module may include a voltage supply node configured to receive a voltage signal from which the voltage regulator derives the tail voltage. The compensation processor may be operatively coupled to the voltage supply node to receive the voltage signal. The compensation processor may be configured to generate the regulation control signal to modulate the tail voltage as a function of the received voltage signal.

In some examples, the power source module may include a data rate signal generator configured to generate a data rate signal indicative of a data rate of the buffered clock signal. The compensation processor may be operatively coupled to receive the data rate signal and may be configured to generate the regulation control signal as a function of the received data rate signal. The compensation processor may be configured to modulate the tail voltage in response to the received data rate signal.

In various implementations, the compensation processor may be configured to modulate the tail voltage to increase a current through the tail device when the process dependent signal indicates that the QC may be operating at an operating point associated with slower than nominal transistor speed process. The compensation processor may be configured to modulate the tail voltage to decrease a current through the tail device when the process dependent signal indicates that the QC may be operating at an operating point associated with faster than nominal transistor speed process.

In some embodiments, a compensation processor, such as the analog processing circuit 825 described with reference to FIG. 8A, or the digital processing circuit 925 described with reference to FIG. 9A, may be configured to operatively couple to at least one sensor circuit and configured to generate the regulation control signal (e.g., Vref_reg 830, 930) as a function of at least one sensor circuit signal. In various examples, the compensation processor may be configured to generate the regulation control signal in response to, and as a function of, any of a temperature signal, a process signal, a voltage signal, or a data rate signal, or any of these taken alone or in combination with one or more of such signals. Although FIG. 8A, for example, depicts the compensation processor (analog processing circuit 825) as having multiple inputs (i.e., Vprocess, Vtemp, Avcc, Vdatarate), it is understood that a compensation processor may generate Vref_reg in accordance with the principles described herein using any one of those inputs alone, as well as any combination of two or more such inputs (e.g., Vtemp alone, or Vtemp in combination with Vprocess and/or Avcc).

In an exemplary aspect, a power source may include a voltage regulator, at least one sensor circuit, and a compensation processor. The voltage regulator may have an input terminal and an output terminal and be operable to modulate a tail voltage supplied via the output terminal in response to a regulation control signal applied to the input terminal. The output terminal may be operably connected to supply operating power to a driver circuit configured to buffer a clock signal to a control terminal of a tail device of an input circuit in a quantizer circuit (QC). The tail device may be configured to enable or disable operating current through the input circuit of the QC in response to the buffered clock signal, wherein the QC further comprises an output circuit responsively coupled to the input circuit and configured to receive operating power from a first power domain. The at least one sensor circuit may be configured to generate at least one sensor circuit signal indicative of at least one performance characteristic of a plurality of devices in the QC embodied on a semiconductor substrate. The compensation processor may operatively couple to the at least one sensor circuit and be configured to generate the regulation control signal as a function of the at least one sensor circuit signal. The tail voltage may be independently regulatable relative to the first power domain.

In various embodiments, the at least one sensor circuit may further include a process sensor configured to generate a process dependent signal indicative of a timing performance of the plurality of devices in the QC embodied on a semiconductor substrate, wherein the at least one sensor circuit signal comprises the generated process dependent signal. The at least one sensor circuit may further include a temperature sensor configured to generate a temperature signal indicative of a temperature of the plurality of devices in the QC, wherein the at least one sensor circuit signal comprises the generated temperature signal.

The power source may further include a voltage supply node configured to receive a voltage signal from which the voltage regulator derives the tail voltage; the compensation processor may be further operatively coupled to the first power domain, and the compensation processor may be further configured to generate the regulation control signal as a function of the first power domain.

The at least one sensor circuit may further include a temperature sensor configured to generate a temperature signal indicative of a temperature of the plurality of devices in the QC; the at least one sensor circuit signal may include the generated temperature signal.

The power source may further include a voltage supply node configured to receive a voltage signal from which the voltage regulator derives the tail voltage, wherein the compensation processor is further operatively coupled to the first power domain, and the compensation processor is further configured to generate the regulation control signal as a function of the first power domain.

The power source may also include any combination of two or more of the process sensor, voltage node, and temperature sensor, any combination of which may optionally be further combined to include a data rate signal generator configured to generate a data rate signal indicative of a data rate. The compensation processor may be further operatively coupled to receive the data rate signal and configured to generate the regulation control signal as a function of the received data rate signal.

In some examples, the buffered clock signal may have an amplitude that is a function of the tail voltage. The first power domain may include an Avcc power domain, or an Avss power domain. The QC may be operatively coupled to supply a data signal to a downstream circuit, wherein the downstream circuit is coupled to the tail voltage to receive operating power.

In some embodiments, the compensation processor may be configured to modulate the tail voltage to increase a current through the tail device when the QC is operating at an operating point associated with a worst-case clock-to-q corner. The compensation processor may further be configured to modulate the tail voltage to decrease a current through the tail device when the QC is operating at an operating point associated with a worst-case RMS noise corner.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A power source, the power source comprising:
   a voltage regulator having an input terminal and an output terminal and being operable to modulate a tail voltage supplied via the output terminal in response to a regulation control signal applied to the input terminal, the output terminal being operably connected to supply operating power to a driver circuit configured to buffer a clock signal to a control terminal of a tail device of an input circuit in a quantizer circuit (QC), wherein the tail device is configured to enable or disable operating current through the input circuit of the QC in response to the buffered clock signal, wherein the QC further comprises an output circuit responsively coupled to the input circuit and configured to receive operating power from a first power domain;
   at least one sensor circuit configured to generate at least one sensor circuit signal indicative of at least one performance characteristic of a plurality of devices in the QC embodied on a semiconductor substrate; and,
   a compensation processor operatively coupled to the at least one sensor circuit and configured to generate the regulation control signal as a function of the at least one sensor circuit signal,
   wherein the tail voltage is independently regulatable relative to the first power domain.

2. The power source of claim 1, the at least one sensor circuit further comprising a process sensor configured to generate a process dependent signal indicative of a timing performance of the plurality of devices in the QC embodied on a semiconductor substrate, wherein the at least one sensor circuit signal comprises the generated process dependent signal.

3. The power source of claim 2, the at least one sensor circuit further comprising a temperature sensor configured to generate a temperature signal indicative of a temperature of the plurality of devices in the QC, wherein the at least one sensor circuit signal comprises the generated temperature signal.

4. The power source of claim 3, further comprising a data rate signal generator configured to generate a data rate signal indicative of a data rate, wherein the compensation processor is further operatively coupled to receive the data rate signal and configured to generate the regulation control signal as a function of the received data rate signal.

5. The power source of claim 2, further comprising a voltage supply node configured to receive a voltage signal from which the voltage regulator derives the tail voltage, wherein the compensation processor is further operatively coupled to the first power domain, and the compensation processor is further configured to generate the regulation control signal as a function of the first power domain.

6. The power source of claim 5, the at least one sensor circuit further comprising a temperature sensor configured to generate a temperature signal indicative of a temperature of the plurality of devices in the QC, wherein the at least one sensor circuit signal comprises the generated temperature signal.

7. The power source of claim 6, further comprising a data rate signal generator configured to generate a data rate signal indicative of a data rate, wherein the compensation processor is further operatively coupled to receive the data rate signal and configured to generate the regulation control signal as a function of the received data rate signal.

8. The power source of claim 5, further comprising a data rate signal generator configured to generate a data rate signal indicative of a data rate, wherein the compensation processor is further operatively coupled to receive the data rate signal and configured to generate the regulation control signal as a function of the received data rate signal.

9. The power source of claim 2, further comprising a data rate signal generator configured to generate a data rate signal indicative of a data rate, wherein the compensation processor is further operatively coupled to receive the data rate signal and configured to generate the regulation control signal as a function of the received data rate signal.

10. The power source of claim 1, the at least one sensor circuit further comprising a temperature sensor configured to generate a temperature signal indicative of a temperature of the plurality of devices in the QC, wherein the at least one sensor circuit signal comprises the generated temperature signal.

11. The power source of claim 10, further comprising a voltage supply node configured to receive a voltage signal from which the voltage regulator derives the tail voltage, wherein the compensation processor is further operatively coupled to the first power domain, and the compensation processor is further configured to generate the regulation control signal as a function of the first power domain.

12. The power source of claim 11, further comprising a data rate signal generator configured to generate a data rate signal indicative of a data rate, wherein the compensation processor is further operatively coupled to receive the data rate signal and configured to generate the regulation control signal as a function of the received data rate signal.

13. The power source of claim 10, further comprising a data rate signal generator configured to generate a data rate signal indicative of a data rate, wherein the compensation processor is further operatively coupled to receive the data rate signal and configured to generate the regulation control signal as a function of the received data rate signal.

14. The power source of claim 1, further comprising a voltage supply node configured to receive a voltage signal from which the voltage regulator derives the tail voltage, wherein the compensation processor is further operatively coupled to the first power domain, and the compensation processor is further configured to generate the regulation control signal as a function of the first power domain.

15. The power source of claim 14, further comprising a data rate signal generator configured to generate a data rate signal indicative of a data rate, wherein the compensation processor is further operatively coupled to receive the data rate signal and configured to generate the regulation control signal as a function of the received data rate signal.

16. The power source of claim 1, wherein the QC further comprises offset correction circuitry.

17. The power source of claim 1, wherein first power domain comprises an Avcc power domain.

18. The power source of claim 1, wherein first power domain comprises an Avss power domain.

19. The power source of claim 1, wherein the QC is operatively coupled to supply a data signal to a downstream circuit, wherein the downstream circuit is coupled to the tail voltage to receive operating power.

20. The power source of claim 1, wherein the compensation processor is configured to modulate the tail voltage to increase a current through the tail device when the QC is operating at an operating point associated with a worst-case clock-to-q corner, and configured to modulate the tail voltage to decrease a current through the tail device when the QC is operating at an operating point associated with a worst-case RMS noise corner.

* * * * *